United States Patent [19]

Casper et al.

[11] Patent Number: 5,838,749
[45] Date of Patent: Nov. 17, 1998

[54] METHOD AND APPARATUS FOR EXTRACTING AN EMBEDDED CLOCK FROM A DIGITAL DATA SIGNAL

[75] Inventors: Paul W. Casper, West Melbourne; Jeffrey S. Grant, Palm Bay; Marc E. Sawyer, Melbourne, all of Fla.

[73] Assignee: Broadband Communications Products, Inc., West Melbourne, Fla.

[21] Appl. No.: 462,168

[22] Filed: Jun. 5, 1995

[51] Int. Cl.$^6$ .................................................... H04L 7/00
[52] U.S. Cl. ............................ 375/376; 370/503; 331/18
[58] Field of Search ..................................... 375/294, 354, 375/376, 359, 371, 372, 373; 370/503, 516, 518; 327/105, 145, 156; 331/18; 380/9

[56] References Cited

U.S. PATENT DOCUMENTS

| | | | |
|---|---|---|---|
| 4,538,119 | 8/1985 | Ashida | 331/1 A |
| 4,926,447 | 5/1990 | Corsetto et al. | 375/120 |
| 5,121,416 | 6/1992 | Takano | 375/110 |
| 5,164,965 | 11/1992 | Karaali | 375/106 |
| 5,367,545 | 11/1994 | Yamashita et al. | 375/118 |
| 5,371,766 | 12/1994 | Gersbach et al. | 375/119 |
| 5,410,600 | 4/1995 | Toy | 380/9 |
| 5,432,827 | 7/1995 | Mader | 375/576 |
| 5,448,598 | 9/1995 | Yousefi et al. | 375/376 |

*Primary Examiner*—Wellington Chin
*Assistant Examiner*—Jean B Corrielus
*Attorney, Agent, or Firm*—Charles E. Wands

[57] ABSTRACT

A data and clock recovery arrangement, for a high speed fiber optic digital communication system in which a serial digital bit stream is pre-scramble encoded by interleaving complementary pairs of overhead bits between successive groups of data bits, and then scrambled and transmitted to a receive site, comprises a data rate independent variable bit rate synchronizer, a descrambler and a decoder. The data rate independent variable bit synchronizer processes the received scrambled and encoded digital bit stream to derive a variable data rate synchronization clock signal. The synchronizer is capable of accepting any data rate within the operational data clock signal range of the system, and automatically tunes itself to the data clock signal embedded in the received scrambled and encoded serial data stream, so as to output respective scrambled and encoded serial data and clock signals. The descrambler descrambles the scrambled and encoded serial digital bit stream using the variable data rate synchronization clock signal, and the decoder decodes the descrambled serial digital bit stream to extract groups of data bits exclusive of the complementary pairs of overhead bits and to derive an output clock signal having a frequency coincident with the data rate of the data bits.

53 Claims, 10 Drawing Sheets

CODING RULES: 1) ALWAYS A TRANSITION AT BEGINNING OF INTERVAL
2) 1=NO TRANSITION IN MIDDLE OF INTERVAL
3) 0=POSITIVE TRANSITION IN MIDDLE OF INTERVAL

METHOD AND APPARATUS FOR EXTRACTING AN EMBEDDED CLOCK FROM A DIGITAL DATA SIGNAL

FIELD OF THE INVENTION

The present invention relates in general to communication systems, and is particularly directed to a new and improved high speed, wide data rate range (e.g. 10–300 Mb/s), fiber optic digital communication system, which employs a scrambled data encoding format and clock recovery configuration, that allows a receiver to automatically tune itself to the bit rate of the transported digital data stream and recover both the clock and the data irrespective of its frequency within the data rate range.

BACKGROUND OF THE INVENTION

Because of their ability to transport signals over a very wide bandwidth, fiber optic communication systems, such as that diagrammatically illustrated in FIG. 1, are now preferred over and are being installed to replace conventional metallic cable networks. In the system of FIG. 1, for a one-way (west-to-east) transmission path from a 'west' site 1 to an 'east' site 2, digital data to be transmitted, together with its associated clock, are coupled to an electro-optic transmitter 3. The transmitter generates an optical signal that replicates a serial digital data stream, in which the input clock is embedded with the data, the optical signal being applied to a west (uplink) end of an optical fiber link 4. At the east (downlink) end of the fiber link 4, an opto-electronic receiver 5 detects the incoming optical signal, and processes the received serial digital signal stream, to recover the original data and clock signals.

Now, although the wide band characteristics of optical fiber provides the user with the ability to transport a variety of broadband signals and offers considerable flexibility in the choice of data rates to be used to transport serialized digital data, at relatively high data rates (e.g. those above ten and on the order of several hundred MHz, for example), the limited performance capabilities of readily available and less costly electronic circuits and components (which are not capable of operating with picosecond response times required for high data rate signals) has significantly restricted the use of sophisticated signal processing to embed and recover the clock signal from the serial digital data stream. As a consequence, at such data rates, it has been customary practice to encode the data with a reduced complexity encoding scheme, such as biphase-S encoding, diagrammatically shown for the serialized data stream in FIG. 2, that will allow processing by reasonably priced signal processing equipment. Unfortunately, the use of such encoding schemes also requires that the transmitter and receiver equipment be data (bit) rate-specific, in order for the receiver to successfully determine the data rate, so that the data and clock may be recovered from the received serial data stream.

For the case of the biphase encoding shown in FIG. 2, this problem is illustrated in FIG. 3, which shows respective continuous 1 and 0 patterns that are encoded in accordance with biphase-S encoding rules. For each signal, it will be readily appreciated that without a priori knowledge of the data pattern, the bit rate cannot be accurately determined— hence, the need to use bit rate specific transmitter and receiver components.

SUMMARY OF THE INVENTION

In accordance with the present invention, the above described inability of conventional high speed (fiber optic) digital communication system signal processing components to be employed for variable data rate digital data transmissions is successfully addressed by the combination of a data encoding and dual (phase locked) loop clock recovery mechanism, that allows digital data serial communications to be conducted over the fiber at a wide range of data rates (e.g. 10–300 Mb/s), while enabling the receiver to automatically recover the clock signal embedded in the transported digital data stream, without a priori knowledge of the data pattern.

For this purpose, advantage is taken of a pre-scramble encoding scheme described in the U.S. Pat. No. 5,410,600 (hereinafter referred to as the '600 patent), to J. Toy, entitled: "Pre-scramble encoding method and apparatus for digital communication," issued Apr. 25, 1995, assigned to the assignee of the present application and the disclosure of which is incorporated herein, that enables a novel variable bit synchronization mechanism in the receiver to derive a relatively close or 'macro' estimate of the frequency of the embedded clock signal, that is within a few percent of the clock frequency (which may be anywhere within a relatively wide range, e.g., 10–300 MHz). This relatively close data rate estimate is used to initially set the output frequency of a highly precise (numerically controlled) reference clock generator to within a selected octave tuning range of the measured data rate. Then, using a 'micro' phase locked tuning loop, the frequency of the reference clock generator is adjusted to sweep the output of the reference clock generator through a vernier frequency range that encompasses the frequency uncertainty of the measured data rate, so as to bring the receiver into lock with the embedded data rate clock.

Because of the characteristics of the received scrambled serial digital bit stream that has been pre-scramble encoded using the scheme described in the above-referenced '600 patent, the received data contains a sufficient repetition rate of logic level transitions to guarantee that, within a prescribed analysis window, the bit rate estimator is capable of deriving a relatively 'close' estimate of the data rate, that is within several percent of the data rate. This 'close' data rate (bit sync) estimate is used to establish the frequency of a precision reference clock signal generated by a direct digital synthesizer, that is controllably variable over a single clock frequency octave (e.g. 2.34375 to 4.68750 MHz), that is relatively narrow compared with the 10–300 MHz data clock range of variation.

This single octave tuning range precision reference clock signal is applied to a first, tunable 'inner' phase locked loop. Based upon the bit sync estimate derived by the data rate estimator, the output of the first phase locked loop is scaled to a frequency octave that contains the data rate estimate, and produces a variable data rate sync clock signal that falls within that octave. This signal is used by downstream descrambler and the decoder circuitry to recover the data.

The received serial data stream and the variable rate clock signal generated by the first phase locked loop are coupled to a second tunable 'outer' phase locked loop. This second tunable phase lock loop includes a sweep generator that varies the center frequency of the scaled direct digital synthesizer over a frequency range that encompasses the clock signal uncertainty of the estimated clock signal. Namely, the sweep generator sweeps the output voltage of the 'outer' loop filter of the second phase locked loop, so as to effect a 'vernier' adjustment of the reference clock generated by the direct digital synthesizer. As the reference clock is finely adjusted, eventually the variable data rate sync clock signal generated by the first tunable phase lock loop and supplied to the downstream descrambler and decoder circuitry will coincide with the embedded clock signal. Upon this embedded clock and vernier tuned reference clock coincidence, the outer loop will lock and a frame synchronization detection circuit within the decoder will change the state of a 'synchronization loss' logic level that is fed back from the decoder to the variable bit synchronizer, causing the sweep circuit to be disabled. The output of the direct digital synthesizer is then locked to what is a precisely stable frequency within its output octave range (scaled up by the first phase locked loop's oscillator circuitry to a precisely stable embedded clock frequency).

The descrambler comprises a conventional feed-forward, modulo-two descrambler, which is configured in a complementary fashion with respect to the modulo-two scrambler at the transmitter site. The output of the descrambler is a descrambled data signal which is coupled, together with the extended data rate clock, to the decoder. For the extended (9/8) data rate of the preferred embodiment of the pre-encoding mechanism employed in the communication system of the present invention, the decoder contains a 1:9 demultiplexer, which demultiplexes each successive data byte from the descrambler for application to a downstream 8:1 multiplexer. The demultiplexed ninth, overhead bit is applied to a frame synchronization detector circuit. The frame synchronization detector circuit provides a bit slip signal to the 1:9 demultiplexer, for iteratively shifting the received data bits by one bit until frame synchronization is achieved. It also outputs the above-referenced frame synchronization loss logic level used to control the operation of the variable bit synchronizer.

The extended data rate clock signal is divided into a fractional rate clock signal (within a range of 1.25–37.5 MHz), which is coupled to the frame synchronization detector circuit and to a times eight (×8) phase locked loop. The 8:1 multiplexer effects a divide-by-eight operation, so as to provide a fractional received clock signal (also in the frequency range of 1.25–37.5 MHz), which is coupled to the times eight (×8) phase locked loop. The ×8 phase lock circuit is looped with the 8:1 multiplexer to control the recovery of the embedded clock signal for the intended data rate range of 10–300 Mb/s.

DETAILED DESCRIPTION

Figure 1:
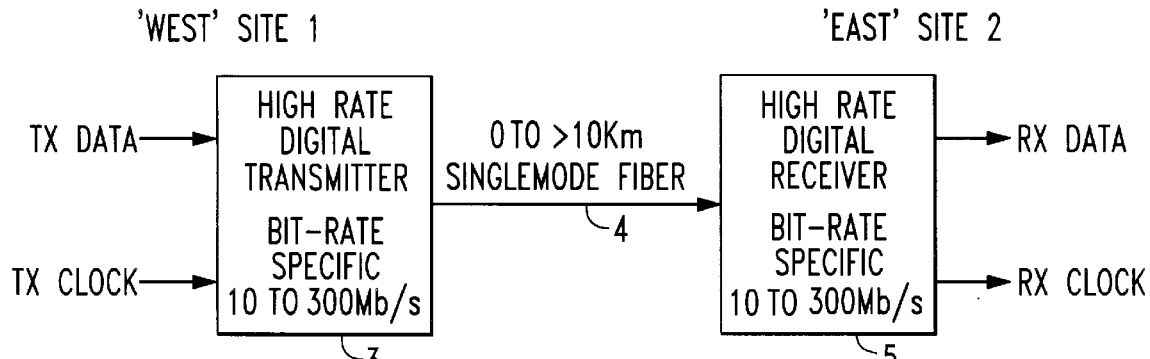
FIG. 1 diagrammatically illustrates a fiber optic communication system.
Figure 2:
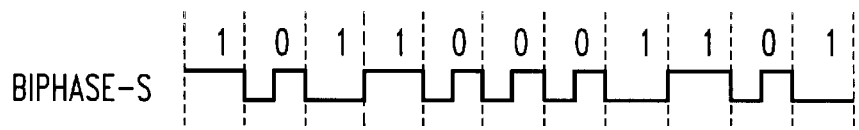
FIG. 2 diagrammatically shows a serialized data stream encoded by means of biphase-S encoding.
Figure 3:
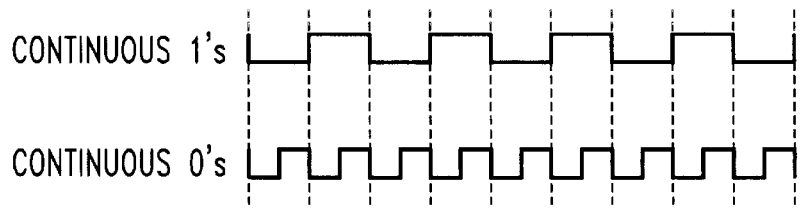
FIG. 3 diagrammatically illustrates respective continuous 1 and 0 patterns encoded in accordance with biphase-S encoding rules.

Before describing in detail the adaptive bit rate synchronization mechanism of the present invention, it should be observed that the invention resides primarily in what is effectively a prescribed set of conventional digital communication signalling components and attendant supervisory firmware and control logic therefor, that supervise the operations and states of such components. Consequently, the configuration of such signal processing components and the manner in which they are interfaced with one another and interface equipment of a digital communication system have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations of the Figures are primarily intended to illustrate the major components of the system in a convenient functional grouping, whereby the present invention may be more readily understood.

As pointed out briefly above, the variable data rate communication scheme in accordance with the present invention preferably employs a complementary overhead bit insertion or interleaving encoding scheme of the type described in the above-referenced '600 patent, in order to ensure that the resulting extended data frames will be both asymmetric and non-periodic, ensuring that the received data contains a sufficient repetition rate of logic level transitions to guarantee that, within a prescribed analysis window, the bit rate estimator is capable of deriving a relatively 'close' estimate of the data rate, that is within several percent of the data rate.

More particularly, in the pre-scramble encoding scheme described in the '600 patent, true and inverted (complementary) versions of prescribed bits, termed 'dual bits', are inserted into the (to-be-transmitted) data stream, prior to (modulo-two) scrambling the data. The insertion of these overhead bits makes data frames both asymmetric and non-periodic, so that it will conform with balance and frequent transition requirements of fiber optic networks. The locations of the dual bits are such that the longest possible series of consecutive bits in an identical state, high or low, is less than a predetermined number. The longest series of identical bits is related to the length of the data bit sequences and to placement of the dual bits. (If desired, the data may be resequenced for insertion into the serial data stream, to enhance error detection when parity checking is used).

As a non-limiting example, complementary overhead bits may be inserted or interleaved into the serial data stream at opposite ends of successive sequences of data bytes, so that there is an additional overhead bit for every eight data bits. What results is an extended or augmented data rate digital bit stream, in which the original data rate is increased by nine-eighths of its original data rate, in order to accommodate the insertion of an additional (overhead) bit per byte.

Figure 4:
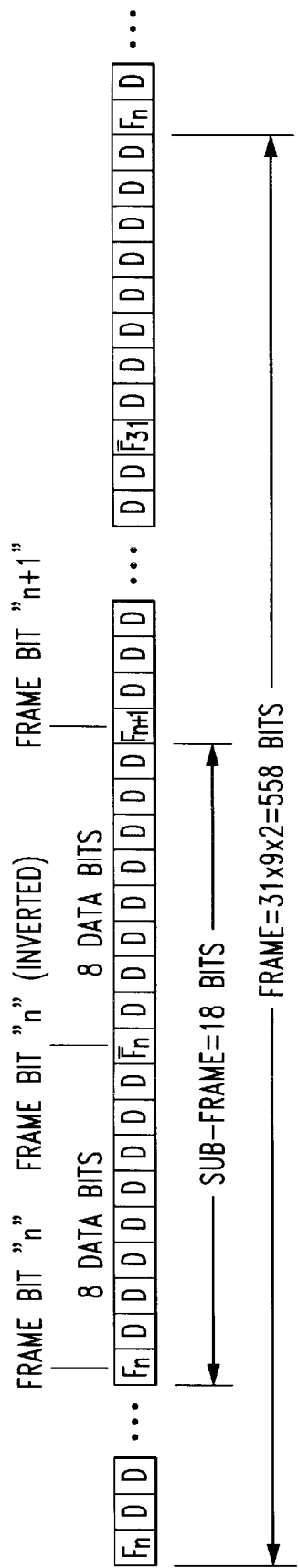
FIG. 4 shows a complementary overhead bit insertion encoding scheme of the type described in U.S. Pat. No. 5,410,600.

Namely, as shown in the encoding diagram FIG. 4, true and inverted (complementary) framing bits $F_n$ and $F_n$BAR are inserted between eight successive data bits (D) of the serial stream, prior to (modulo-two) scrambling. In the illustrated example of FIG. 4, the inserted complementary framing bits guarantee a transition every twenty-six bits, at a maximum, thereby preventing scrambler lock-up. For the present example of interleaving complementary overhead bits between successive bytes (eight bits) of data, the extended data rate stream has its data (bit) rate increased or extended by nine-eighths of its original data rate, to accommodate the insertion of an additional (overhead) bit per byte. Thus, for a non-limiting variable data rate range of 10–300 Mb/s, the actual data rate of the scrambled data stream lies within an extended data rate range of 11.25–337.5 Mb/s.

Figure 5:
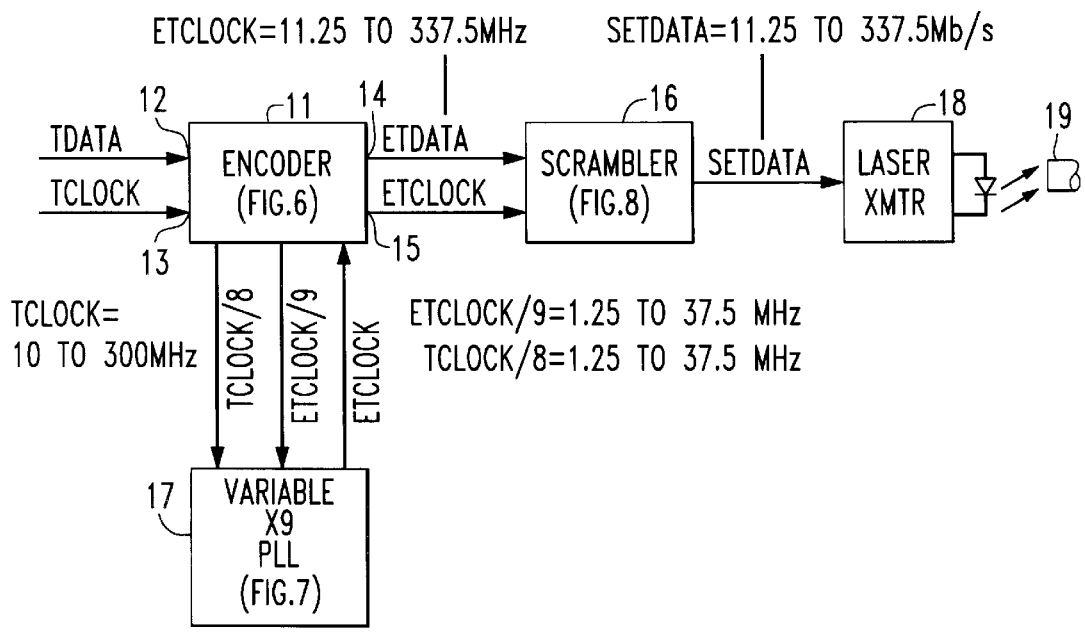
FIG. 5 diagrammatically illustrates the architecture of a variable rate high speed transmitter in accordance with an embodiment of the invention.

The architecture of a variable rate high speed transmitter, which is operative to transmit a serial digital data stream, that is encoded and scrambled in accordance with the pre-scramble encoding mechanism and scrambling scheme of the type described in the above-referenced '600 patent is diagrammatically illustrated in FIG. 5. As shown therein the transmitter comprises a pre-scramble encoder 11 (shown in detail in FIG. 6, to be described), to input ports 12 and 13 of which a serial digital data signal TDATA and an associated clock signal TCLOCK are supplied from an associated conventional differential digital input interface, not shown. As described above, for purposes of providing a non-limiting example of a variable data rate range, it will be understood that the TCLOCK signal may have a clock frequency anywhere from 10 to 300 MHz.

Figure 8:
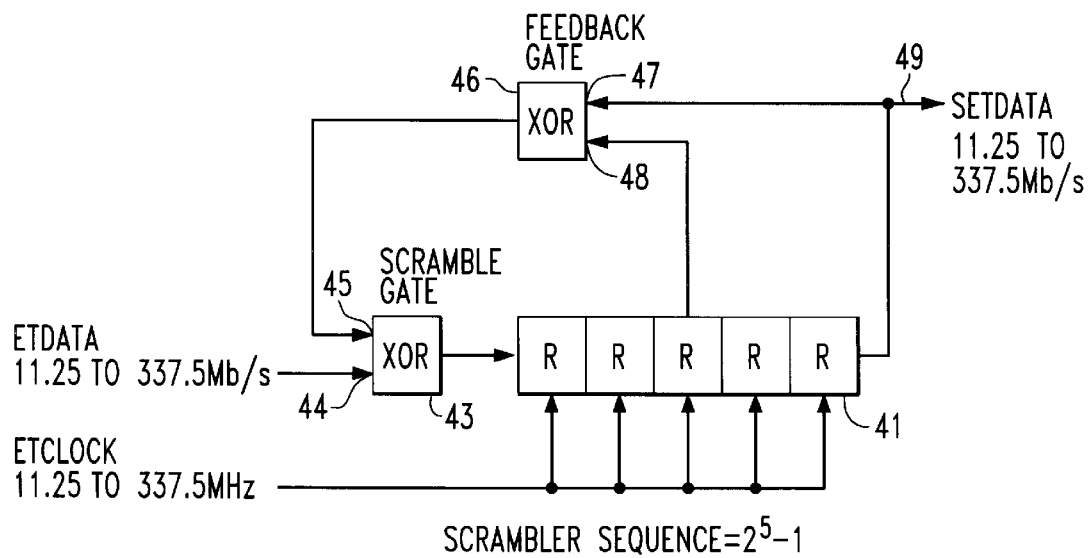
FIG. 8 diagrammatically shows the configuration of a scrambler employed in the transmitter of FIG. 5.

Pre-scramble encoder 11 is operative to interleave successive individual ones of pairs of complementary overhead bits between successive bytes of serial data TDATA supplied to input port 11, using the interleaving mechanism described in the '600 patent, and thereby producing a 9/8 extended data rate ETDATA signal at output port 14, and a 9/8 extended data rate ETCLOCK signal (11.25–337.5 MHz) at output port 15, for application to an associated modulo-two data scrambler 16 (shown in detail in FIG. 8, to be described). The output of the data scrambler 16 is applied as the input drive signal to a laser transmitter 18, which emits a scrambled optical signal into an optical fiber link 19 for transmission thereover to a downstream receiver site.

Figure 7:
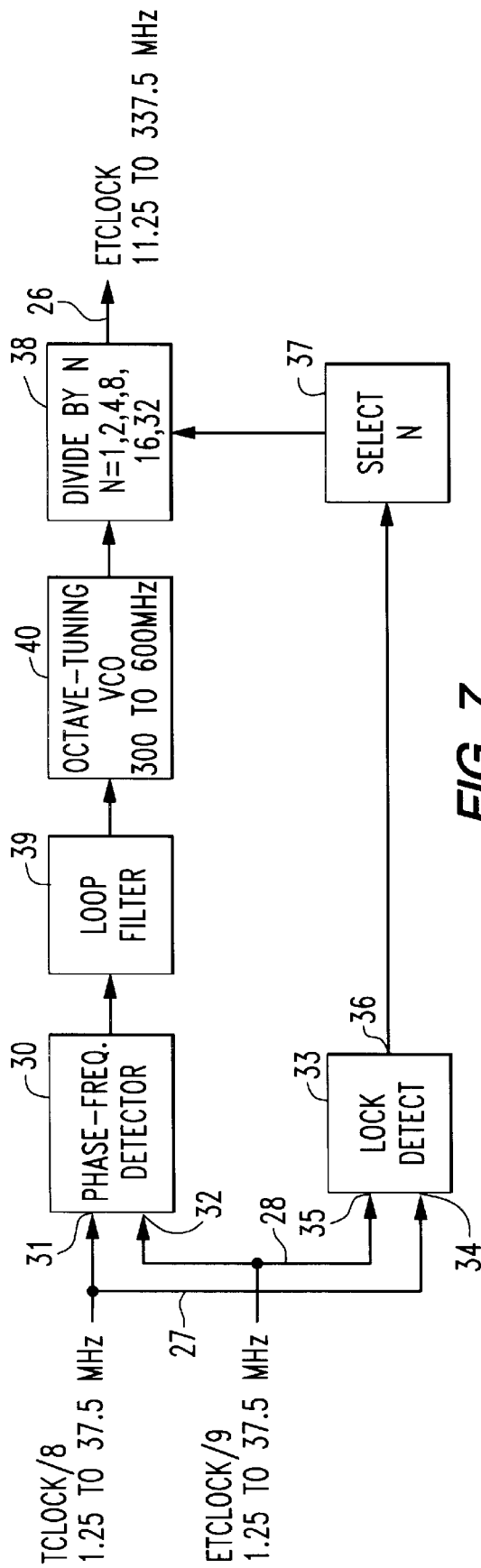
FIG. 7 diagrammatically shows the configuration of the ×9 phase locked loop portion of the transmitter of FIG. 5.

Coupled with pre-scramble encoder 11 is a variable x9 phase locked loop circuit 17 (shown in detail in FIG. 7, to be described). The x9 phase locked circuit 17 is looped with a 1:8 demultiplexer and an associated 9:1 multiplexer within the pre-scramble encoder 11, for the purpose of controlling the insertion of successive ninth overhead bits (corresponding to the frame bits F in FIG. 4) into the input data stream and thereby convert the data rate from a range of 10–300 Mb/s to 11.25–337.5 Mb/s.

Figure 6:
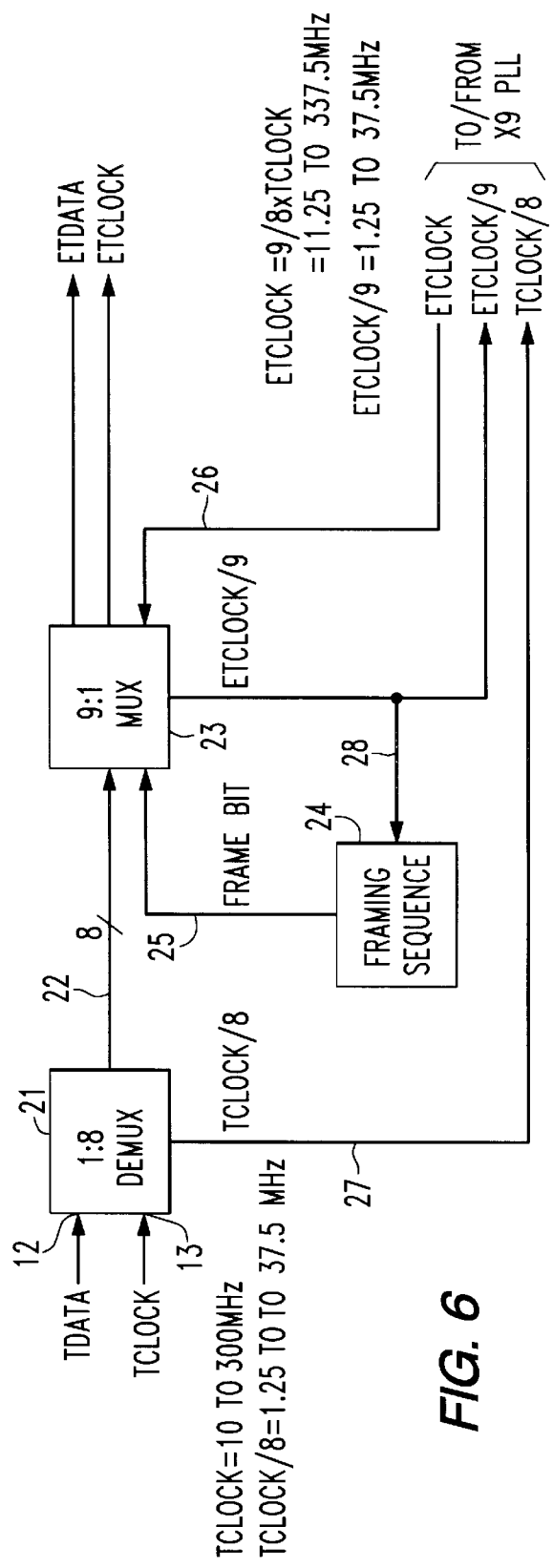
FIG. 6 diagrammatically shows the configuration of the encoder portion of the transmitter of FIG. 5.

As shown in detail in FIG. 6, pre-scramble encoder 11 comprises a 1:8 demultiplexer 21, which is coupled to TDATA port 12 and TCLOCK port 13 and is operative to demultiplex the eight data bits (bits 0–7) of the input TDATA stream at input data port 12 onto an eight bit parallel bus 22 for application to eight inputs of a 9:1 multiplexer 23. At every ninth clock signal, a framing sequence generator (programmable logic device) 24 outputs successive bits and their complements of a pseudo random framing bit pattern over a line 25 to a ninth input of 9:1 multiplexer 23.

The clocking signal for framing sequence generator 24 is derived by a fractional clock signal ETCLOCK/9 generated by 9:1 multiplexer from an ETCLOCK signal supplied over an ETCLOCK line 26 from the phase locked loop 17. The ETCLOCK signal is an extended data rate clock corresponding to 9/8 times the TCLOCK signal, or nine times one eighth of the TCLOCK signal applied to 1:8 demultiplexer 21. Thus, the ETCLOCK signal has a frequency range of 11.25–337.5 MHz, and an ETCLOCK/9 fractional signal has a frequency range of 1.25–37.5 MHz.

A TCLOCK/8 signal (which has the same frequency range (1.25–37.5 MHz) as the ETCLOCK signal) is produced by the 1:8 signal division operation performed by demultiplexer 21 with respect to the TCLOCK signal applied to its TCLOCK port 13. The TCLOCK/8 signal supplied to the x9 phase locked loop circuit 17 of FIG. 7 via TCLOCK/8 line 27. Similarly, an ETCLOCK/9 signal is produced by a 9:1 signal division operation performed by multiplexer 23 with respect to the ETCLOCK signal supplied via ETCLOCK clock line 26. The ETCLOCK/9 signal is coupled over line 28 to the framing sequence generator 24 and to the x9 phase locked loop circuit 17 of FIG. 7.

The x9 phase locked loop circuit 17 is shown in detail in FIG. 7 as comprising a phase/frequency detector 30 having a first input 31 coupled to receive the (1.25–37.5 MHz) TCLOCK/8 fractional clock signal on line 27 from 1:8 demultiplexer 21 and a second input 32 coupled to receive the (1.25–37.5 MHz) ETCLOCK/9 signal on line 28 from the 9:1 multiplexer 23 of the pre-scramble encoder 11 of FIG. 6. In addition, a lock detector 33 has a first input 34 coupled to receive the (1.25–37.5 MHz) TCLOCK/8 signal on line 27 from 1:8 demultiplexer 21, and a second input 35 coupled to receive the (1.25–37.5 MHz) ETCLOCK/9 signal on line 28 from the 9:1 multiplexer 23. The output 36 of lock detector 33 is coupled to a divisor code selector 37, which successively outputs a sequence of codes associated with respective divisor values for controlling the operation of an octave stepped divider 38.

The output of phase/frequency detector 30 is coupled through a loop filter 39 to an octave-tuning voltage-controlled oscillator 40. The output of octave-tuning voltage-controlled oscillator 40 is a precision scaled-up clock signal having a frequency in a range on the order of 300–600 MHz and is applied to octave-stepped divider 38. Under the control of the octave select code provided by divisor code selector 37, the output of octave-stepped divider 38 controllably divides the precision scaled-up clock signal generated by octave-tuning voltage-controlled oscillator 40, to produce an ETCLOCK signal on line 26 in a frequency range of 11.25–337.5 MHz.

FIG. 8 diagrammatically illustrates the configuration of a conventional feed-forward, modulo-two scrambler 16, which comprises a multibit shift register 41, to a first stage 42 of which the output of an exclusive OR circuit 43 is coupled. In accordance with a non-limiting example, modulo-two scrambler 16 may be a five (shift register) stage device, so as to reduce the time required for its complementary (five stage) descrambler at the receiver (to be described) to acquire frame sync, and thereby allow the use of a shorter data transition measurement window by the bit rate estimator of the receiver's the variable bit synchronizer.

Exclusive OR circuit 43 has a first input 44 coupled to receive the ETDATA signal from the output port 14 of the pre-scramble encoder 11, and a second input 45 coupled to receive the output of a second an exclusive OR circuit 46. Exclusive OR circuit 46 has a first input 47 coupled to a selected stage of shift register 41 and a second input 48 coupled to the output stage 48 of shift register 41, from which a SETDATA signal line 49 is derived. The ETCLOCK output port 15 of the pre-scramble encoder 11 is coupled to the clock inputs of the respective stages of shift register 41. The output line 49 from the shift register 41 provides a modulo-two scrambled data signal SETDATA, which is coupled via line 49 to laser transmitter 18 of FIG. 5. The laser transmitter is of conventional construction, and preferably comprises a voltage-to-current converter to which the SETDATA signal is applied, the output of the voltage-to-current converter being coupled to a biased laser diode for generating the optical signal to be transported over the fiber link 19.

Figure 9:
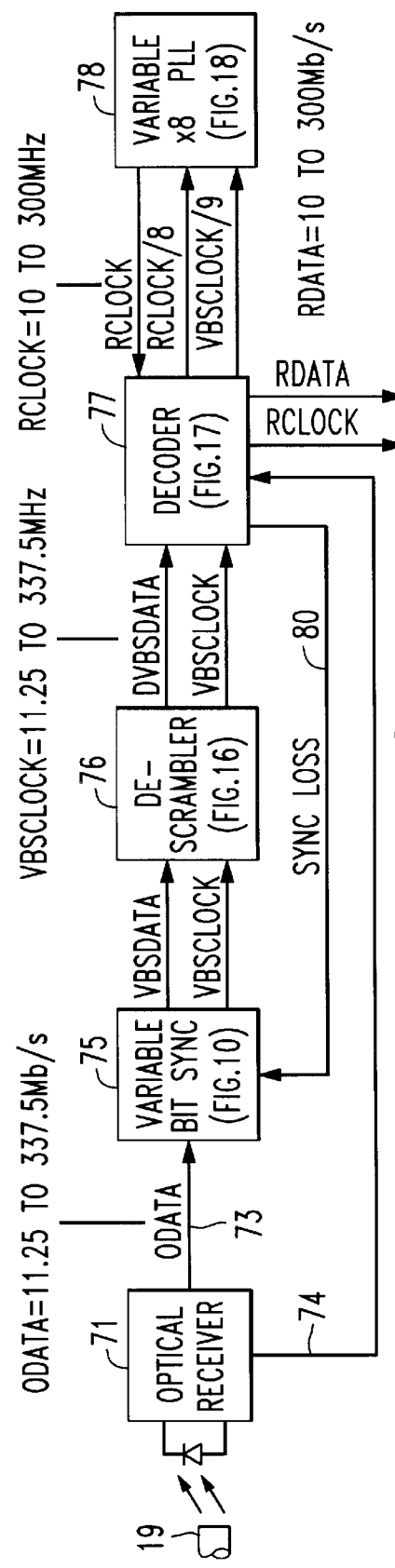
FIG. 9 diagrammatically illustrates the architecture of a variable rate high speed receiver in accordance with an embodiment of the invention.

The overall architecture of the variable rate high speed receiver of the present invention, which is coupled to the downstream end of the optical fiber link 19, is diagrammatically illustrated in FIG. 9 as comprising an opto-electronic receiver unit 71 of conventional construction, having an opto-electronic converter (photodiode) that is optically interfaced with the digital communication signal-transporting optical fiber link 19 from the transmit site. The output current signal from the opto-electronic receiver unit is coupled through an associated transimpedance amplifier and attendant limiter circuitry, for providing a digital output signal ODATA on a serial data link 73, that replicates the pulses and the transitions in the scrambled digital data stream sourced from the upstream transmit site to which a far end of fiber optic link is coupled. The opto-electronic receiver unit also includes low level detection circuitry (not shown), which outputs a loss of optical signal on link 74 in response to a loss of or too low an optical signal.

As described above, for the extended (%) data rate of the present example, the frequency of the scrambled serial data stream ODATA on serial data link 73 will lie somewhere in a range of 11.25–337.5 MHz. This extended data rate data stream signal ODATA is input to a variable bit synchronizer 75, to be described below with reference to FIGS. 10–14. Pursuant to the present invention, variable bit synchronizer 75 is operative to automatically tune itself to the data clock signal embedded in the receive serial data stream, in order to effect data and clock signal recovery for the downstream cascaded descrambler and decoder circuits 76 and 77, respectively connected in cascade to the output of the variable bit synchronizer 75. A variable ×8 phase locked loop circuit 78 is coupled in a feedback loop path with decoder circuit 77 for recovering the received clock RCLOCK, as will be described.

As will be described in detail below with reference to FIGS. 10–15, the variable bit synchronizer 75 includes a bit rate estimator that analyzes transitions in the ODATA signal and derives therefrom a reasonably 'close' estimate of the data rate of the received signal to within a prescribed embedded clock signal resolution (typically within 2% of the data rate). This 'close' data rate estimate is used to control the operation of a direct digital synthesizer containing a numerically controlled oscillator, which generates a first precision (crystal-sourced) reference clock signal, that is controllably variable over a first limited clock frequency octave (2.34375 to 4.68750 MHz).

This first precision reference clock signal is applied to a first, tunable 'inner' phase locked loop. Based upon the bit frequency estimate derived by the bit rate estimator, the output of the first phase locked loop is scaled to a frequency range (octave) selected in accordance with the bit frequency estimate, so that the first tunable phase lock loop produces data rate clock signal VBSCLOCK that falls within that range. This VBSCLOCK signal is coupled to the descrambler 76 and the decoder 77.

The scrambled serial data stream ODATA and the variable data rate sync clock signal VBSCLOCK generated by the first phase locked loop are coupled to a second tunable 'outer' phase locked loop. The second tunable phase lock loop includes a sweep generator that is operative vary the scaled direct digital synthesizer frequency over a frequency range that is centered about the embedded clock estimate and is slightly wider than its frequency uncertainty. Namely, the loop filter sweep generator sweeps the output voltage of the loop filter of the second phase locked loop, which is digitized and applied to control the direct digital synthesizer frequency, until the variable data rate sync clock signal generated by the first tunable phase lock loop coincides with the embedded clock signal. At this point, the decoder 77 removes a loss of sync signal input to the variable bit synchronizer 71, indicating that the embedded data clock has been acquired and locked on.

The descrambler 76 comprises a conventional feedforward, modulo-two descrambler, which is configured in a complementary fashion with respect to the scrambler at the transmitter site. The output of the descrambler is a descrambled data signal DVBSDATA, which is coupled, together with the VBSCLOCK to the decoder 77. The decoder 77 contains a 1:9 demultiplexer which is operative to demultiplex the eight data bits of the input DVBSDATA stream from the descrambler 76 to a downstream 8:1 multiplexer, and the ninth, overhead bit to a frame synchronization detector circuit. The frame synchronization detector circuit provides a bit slip signal to the 1:9 demultiplexer, for iteratively shifting the received data bits by one bit until frame synchronization is achieved by an internal frame synchronization detector.

The VBSCLOCK signal is demultiplexed into a VBSCLOCK/9 signal (falling in a range of 1.25–37.5 MHz) which is coupled to the frame synchronization detector circuit and to the times eight (×8) phase locked loop 78. The 8:1 multiplexer effects a divide-by-eight operation, so as to provide an RCLOCK/8 clock signal (also in the frequency range of 1.25–37.5 MHz), which is coupled to the times eight (×8) phase locked loop 78. The ×8 phase lock circuit 78 is looped with the 8:1 multiplexer to control the recovery of the embedded clock signal RCLOCK for the intended range of 10–300 MHz.

Figure 10:
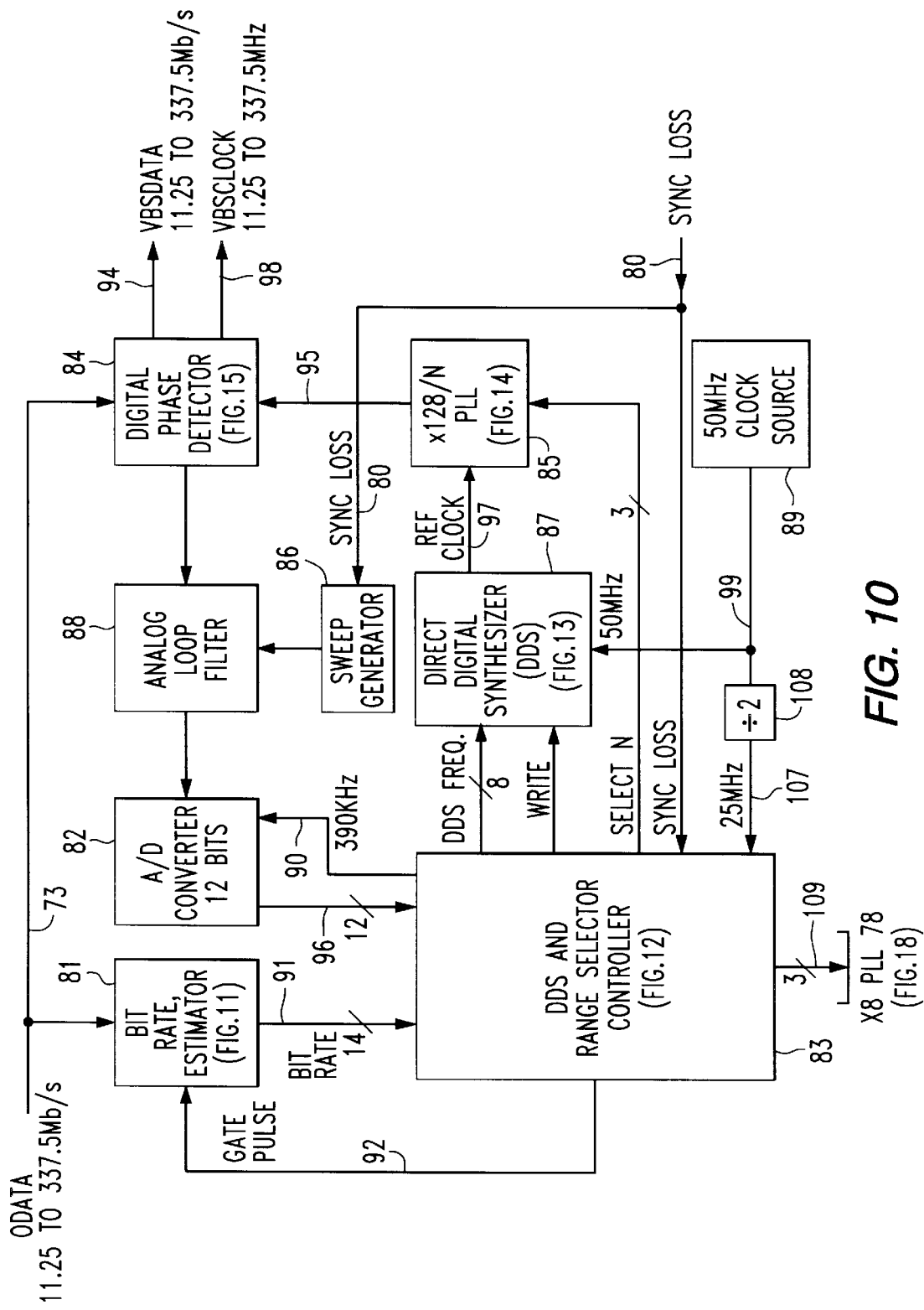
FIG. 10 diagrammatically illustrates the architecture of a variable bit synchronizer of the receiver of FIG. 9.

Referring now to FIG. 10, the variable bit synchronizer 75 of the variable rate high speed receiver architecture of FIG. 9 is diagrammatically illustrated as comprising a variable bit rate estimator 81, which is coupled to serial data line 73 carrying the ⅞encoded and scrambled digital data stream ODATA stream, having a 'to be determined' data rate, that falls somewhere in an extended data rate range of 11.25–337.5 Mb/s, as output by the opto-electronic receiver 71. As will be described, variable bit rate estimator 81 is operative to count positive-going transitions in a divided-down version of the ODATA scrambled serial bit stream, and produces therefrom a multibit binary code representative of a relatively precise measure (e.g., within 2%) of the embedded data rate.

Figure 12:
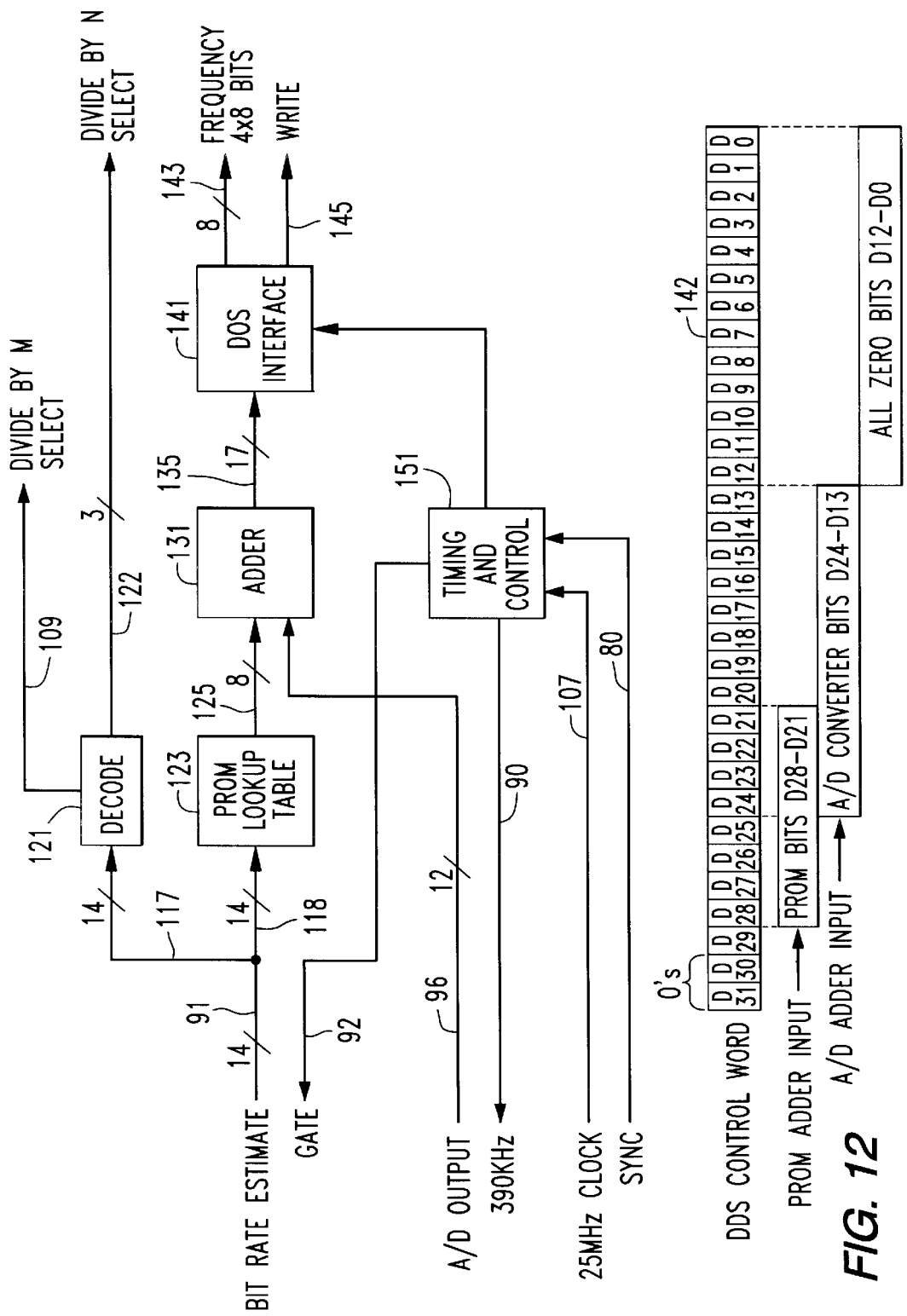
FIG. 12 diagrammatically illustrates the configuration of a direct digital synthesizer (DDS) and range selector controller of the variable bit synchronizer of FIG. 10.

The multi-bit data rate estimate code output by variable bit rate estimator 81 is coupled via a multi-bit link 91 to a direct digital synthesizer (DDS) and range selector controller 83, shown in detail in FIG. 12, to be described. DDS and range selector controller 83 operates on a first parsed segment (comprising a plurality of most significant bits) of the bit rate estimate code to select an N divisor value employed by a first, ×128/N phase locked loop circuit 85 (described in detail below with reference to FIG. 14). This divide-by-N divisor is used to define the divisor value of an octave divider within phase locked loop circuit 85, through which a scaled-up frequency derived from a precision reference clock signal (2.34375 to 4.68750 MHz) generated by a direct digital synthesizer 87 is scaled down or subdivided into a selected range of frequencies for deriving a variable bit sync clock signal, which is applied to a digital phase detector 84 (shown in detail in FIG. 15, to be described). A second parsed segment (formed of a group of least significant bits) of the bit rate estimate code is used by the DDS and range selector controller 83 to generate a thirty-two bit DDS control word (and associated write control signals) representative of the frequency to be generated by a very precise numerically controlled oscillator within the DDS 87.

DDS and range selector controller 83 is also coupled to line 99 to receive a 50 MHz clock signal output by a precision crystal clock generator 89 and to a sync loss signal line 80 from downstream decoder circuitry. In response to acquiring and locking the embedded data clock (RCLOCK), the logic level on a sync loss line 80 from the downstream decoder 77 changes state, so as to effectively disable the clock acquisition mechanism carried out by the adaptive bit rate synchronizer of the present invention, thereby switching it into a tracking mode. The loss of sync signal on line 80 is also coupled to a loop filter sweep generator 86, which, until clock acquisition, continuously generates a sawtooth signal for sweeping the output voltage of an analog loop filter 88 over a range that encompasses the frequency uncertainty of the bit rate estimate produced by bit rate estimator 81. An internal timing and control logic circuit is operative to scale the 50 MHz clock down to a 390 KHZ clock coupled over line 90 for use by an analog-to-digital converter 82. DDS range selector and controller 83 also periodically supplies a gate pulse signal on line 92 to the variable bit rate estimator 81.

Figure 16:
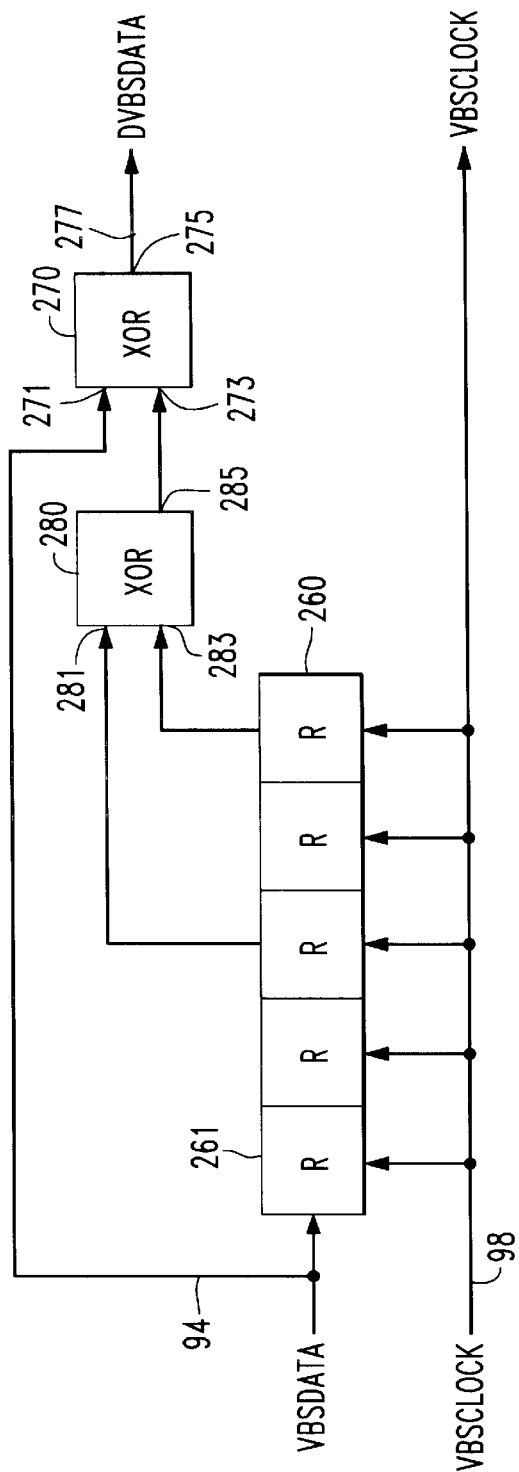
FIG. 16 diagrammatically illustrates the configuration of a descrambler of the receiver of FIG. 9.

In response to the variable bit sync clock signal generated by ×128/N PLL 85, digital phase detector 84 of a second, 'outer' phase locked loop clock recovery feedback path is operative to generate a VBSCLOCK output signal on line 94 and a VBSDATA line 95, which are coupled to the descrambler of FIG. 16. The digital phase detector 84 has an additional control output link, which couple loop filter control signals to analog loop filter 88 of the 'outer' phase locked loop clock recovery feedback path.

Figure 11:
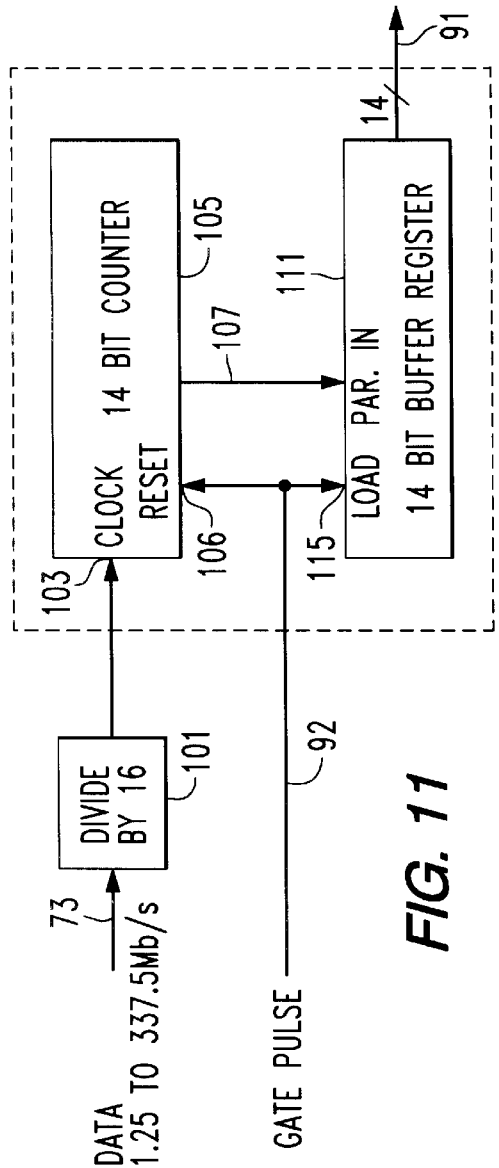
FIG. 11 diagrammatically illustrates the configuration of a variable bit rate estimator of the variable bit synchronizer of FIG. 10.

The variable bit rate estimator 81 of FIG. 10 is diagrammatically illustrated in FIG. 11 as comprising divide-by-sixteen prescaler 101 to which the scrambled digital data stream ODATA on line 73, output by the opto-electronic receiver 71 and including the additional overhead bit for each set of eight data bits, is supplied. (As noted earlier, for an original frequency range of 10–300 MHz of the present example, the data rate of the digital data stream ODATA will be %of this range or 11.25–337.5 Mb/s.) Subdividing the input signal by the divide-by-sixteen prescaler 101 effectively down-converts the ODATA transition rate to a frequency band that allows it to be processed by relatively inexpensive CMOS signal processing circuitry components. (As pointed out previously, since the ODATA serial digital bit stream on line 73 was pre-scramble encoded at the transmitter site using the scheme described in the above-referenced '600 patent, the ODATA data stream contains a sufficient repetition rate of logic level transitions to guarantee that, within a prescribed analysis or gate pulse window, the bit rate estimator 81 will derive a relatively 'close' estimate of the data rate, that is within several percent of the data rate.)

The output of divide-by-sixteen prescaler 101 is coupled to a clock input 103 of a gated binary counter 105, which is operative to count positive-going transitions in the divided-down data signal from prescaler 101 and applies a multi-bit (e.g. 14 bits) binary code representative of the ongoing total over a parallel data link 107 to a multi-bit (e.g. 14 bit) buffer register 111. Each of binary counter 105 and register 111 is controlled via a periodic gate pulse signal coupled over a gate pulse line 92 from a timing and control logic circuit 151 in FIG. 12, to be described.

Gate pulse link 92 is coupled to the reset input 106 of binary counter 105 and to the load input 115 of register 111. In response to a gate pulse signal on line 92, the count value of binary counter 105 is loaded into buffer register 111, and counter 105 is reset. Due to the fact that the scrambled bit stream has been encoded using the mechanism described in the '600 patent, prescribed logic level polarity transitions (e.g. positive-going transitions) in the ODATA serial bit stream will necessarily occur at approximately one-fourth of the bit rate of the scrambled serial bit stream. (Since the count value corresponds to an estimate of one-fourth of the bit rate, as scaled by the prescaler 101, it is proportional to the bit rate and can be scaled (by a factor of four times sixteen, or sixty-four) to a value corresponding to an estimate of the bit rate, per se.)

Therefore, by counting the number of such transitions within a defined time (gate pulse) window, the bit rate estimator 81 is capable of deriving a relatively 'close' estimate of the ODATA clock rate. As the binary count value accumulated in buffer register 111 and coupled over 14-bit frequency output link 91 corresponds to the number of positive-going transitions in the ODATA serial bit stream between successive gate pulses, it provides a relatively precise measure (e.g., within 2%) of the data rate, and thereby the frequency of the clock signal embedded in the received serial data stream.

The 14-bit (data rate representative) binary count value accumulated in buffer register 111 and provided on multi-bit frequency output link 91 is coupled as a bit rate estimate code to a direct digital synchronizer range selector and controller 83, diagrammatically illustrated in FIG. 12. As shown therein, the fourteen bit binary count value of the bit rate estimate code on line 91 are coupled via link 117 coupled to a decoder 121, which translates them into a three bit decoded value on link 122, that is employed to select an N divisor value employed by a frequency range divider in the ×128/N phase locked loop 85, shown in FIG. 14, as will be described.

The 14-bit bit rate estimate code on link 91 are coupled via link 118 to a PROM look up table 123, which maps or translates these eight binary bits into a code format that will be accepted by digital data synchronizer shown 87 in order to control its output frequency. These translated eight bits are coupled via link 125 to one input of an adder 131. As illustrated in the code word diagram 142 in FIG. 12, adder 131 sums the least significant four bits of the eight bit output code on line 125 from the LUT 123 with the four most significant bits of a twelve-bit digital code on link 96 from the twelve-bit precision analog-to-digital converter 82, so as to produce a seventeen bit adder output code on link 135 to a DDS interface 141.

As described briefly above, until lock is achieved, the logic level of a loss of sync signal on line 80 causes loop filter sweep generator 86 of the outer phase locked loop to continuously generates a sawtooth waveform signal for sweeping the output voltage of analog loop filter 88 over a range of operation that encompasses the frequency uncertainty of the bit rate estimate produced by bit rate estimator 81. The analog output of the loop filter 88 is converted by analog-to-digital converter into a twelve-bit digital code on link 96, and is summed with the eight bit output code on line 125 from the LUT 123 so as to produce a seventeen bit adder output code on link 135 to a DDS interface 141.

DDS interface 141 is operative to generate the thirty-two bit DDS control word 142 as having an all zero pattern for bits D0–D12 and bits D30–D31, the seventeen bit adder output code on link 135 as bits D13–D29. The thirty-two bit DDS control word 142 is output on link 143 from DDS interface 141 as a quartet of eight bit code words representative of the frequency to be generated by an extremely precise direct digital synthesizer (numerically controlled oscillator) 87, shown in FIG. 13, to be described. DDS interface 141 also generates write control signals on link 145 associated with the respective quartets of eight bit code words representative of the desired frequency.

Figure 17:
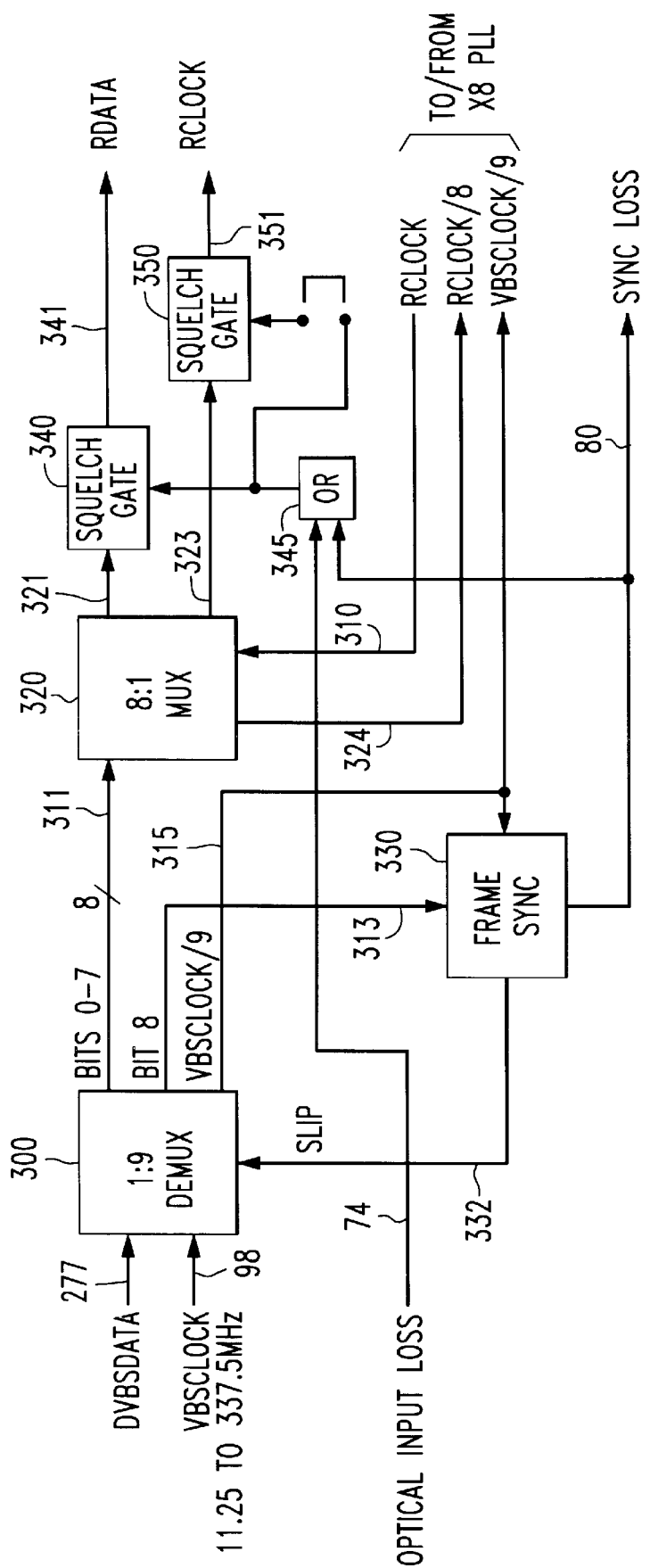
FIG. 17 diagrammatically illustrates the configuration of a decoder of the receiver of FIG. 9.

An internal timing and control (state machine) logic circuit 151 is coupled to line 107 so as receive a (50/2)=25 MHz clock signal output by divide-by-two divider 108, which divides downs the 50 MHz clock signal from clock generator 89 on line 99, and a sync loss signal on line 80 from the decoder 77, shown in FIG. 17, to be described. Timing and control logic circuit 151 contains an internal divider for dividing the 25 MHz clock on line 107 in order to generate a 390 KHz clock on line 90 for use by the analog-to-digital converter 82 supplying the twelve bit word on link 96 to adder 131. It also periodically supplies a gate pulse signal on gate pulse line 92 to the variable bit rate estimator 81 of FIG. 11, described above. Once the embedded data clock has been acquired, the logic level on the sync loss line 80 from the downstream decoder changes state, so as to effectively disable the clock acquisition mechanism carried out by the adaptive bit rate synchronizer of the present invention.

Figure 13:
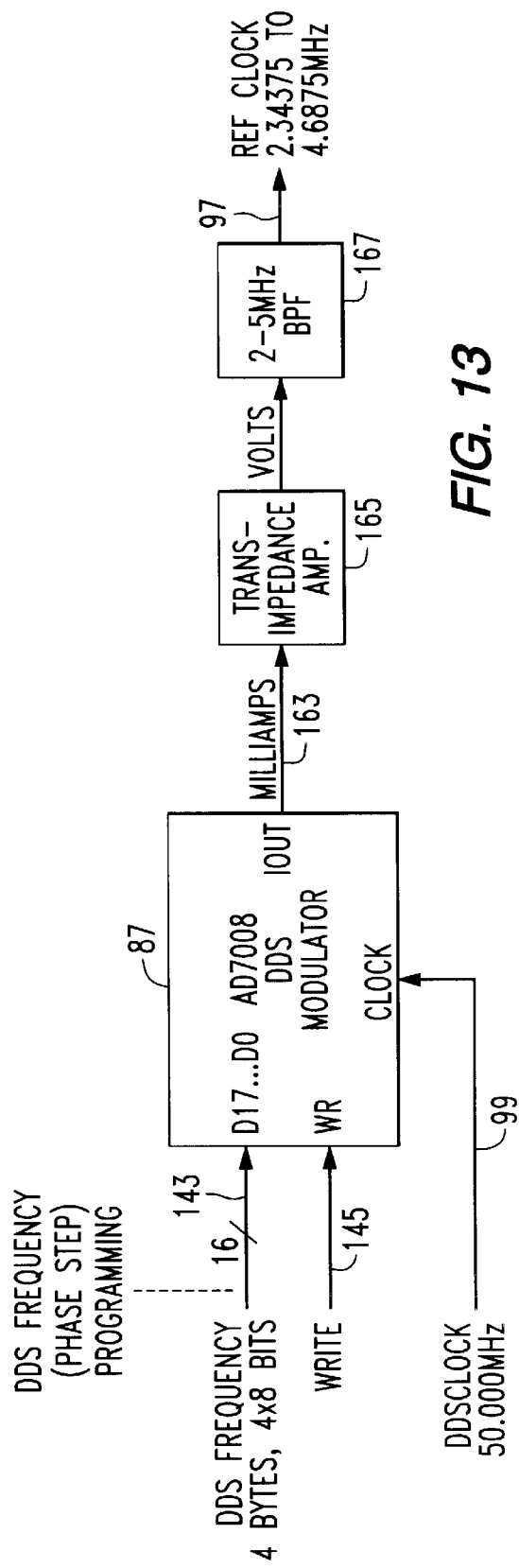
FIG. 13 diagrammatically illustrates a digital data synchronizer of the variable bit synchronizer of FIG. 10.

As pointed out above, and as shown in FIG. 13, under the control of write control signals on link 145, the thirty-two bit DDS control word 142 on link 143 from DDS interface 141 is coupled as a four serial bytes (four, eight-bit code words) representative of the frequency to be generated by direct digital synthesizer (DDS) 87. DDS 87 employs, as its reference clock signal, the extremely precise crystal-sourced 50 MHz clock on line 99 from crystal clock generator 89. The output of the DDS on line 163 is an extremely stable and precise clock current within the operational range of the numerically controlled oscillator (e.g. over an octave of tuning variation from 2.34375 to 4.68750 MHz).

As described previously, this octave of precision tuning range is sufficiently wide as to enable the frequency of the outer phase lock loop to sweep through the range of data rate variation corresponding to the embedded clock signal resolution, until the variable data rate sync clock signal generated by the inner ×128/N phase lock loop 85 coincides with the embedded clock signal in the scrambled data. The numerically controlled clock current signal on line 163 is converted to a clock voltage signal by transimpedance amplifier 165 and then coupled through a 2–5 MHz band pass filter 167, to reference clock output line 97. Reference clock output line 97 provides the very precise clock signal generated by the numerically controlled oscillator (having the octave of tuning variation from 2.34375 to 4.68750 MHZ in the present example).

Figure 14:
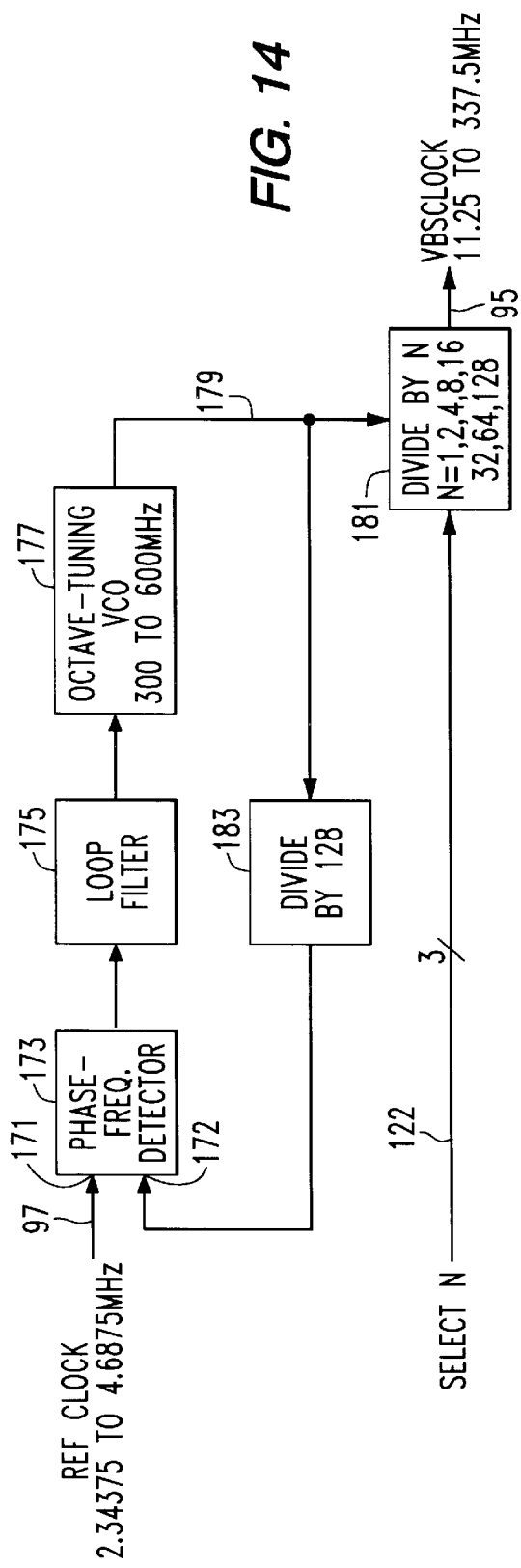
FIG. 14 diagrammatically illustrates the configuration of a ×128/N phase locked loop circuit of the variable bit synchronizer of FIG. 10.

The precision (2.34375 to 4.68750 MHz) reference clock signal on line 97 is coupled to a first input 171 of a phase/frequency detector 173 of a first 'inner' phase locked clock recovery feedback path, including the ×128/N phased lock loop circuit 85, diagrammatically illustrated in FIG. 14, which is operative to generate a scaled-up clock signal in a frequency range of 300–600 MHz, that accurately tracks the precision reference clock signal generated by the direct digital synthesizer. For this purpose, the output of phase/frequency detector 173 is coupled through a loop filter 175 to an octave-tuning voltage-controlled oscillator 177. The output of octave-tuning voltage-controlled oscillator 177 on line 179 corresponds to the precision reference clock frequency (2.34375 to 4.68750 MHz) multiplied by a scaling factor of ($2^7$=128). This precision scaled-up clock signal on line 179 has a frequency in a range of 300–600 MHz and is applied to an octave-stepped divider 181 and to a divide-by-128 divider or prescaler circuit 183. The output of divide-by-128 divider 183 is coupled to a second input 172 of phase/frequency detector 173, thereby completing the closed loop feedback path for precision tracking of the DDS clock signal on reference clock line 97.

The octave-stepped divider 181 controllably divides the precision scaled-up (300–600 MHz) clock signal generated by octave-tuning voltage-controlled oscillator 177 by the three bit decoded value on line 122 from the decoder 121 of FIG. 11, described above, so as to produce on output line 95 the variable bit sync (VBS) clock signal (falling in a range of 11.25–337.5 MHz in the present example), that is used by the downstream decoder 77 of FIG. 17 for data recovery, as will be described. The variable bit sync clock VBSCLOCK signal on link 95 is also coupled to digital phase detector 84 of FIG. 15, as part of an second, 'outer' phase locked loop clock recovery feedback path of the adaptive bit rate synchronization mechanism of the present invention.

Figure 15:
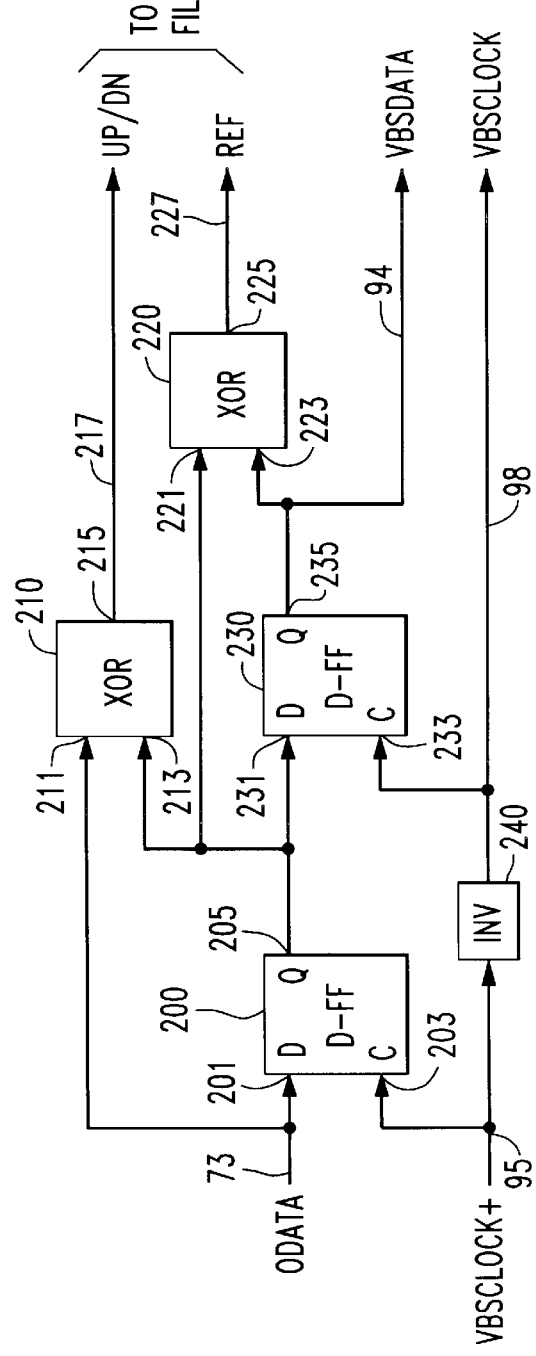
FIG. 15 diagrammatically illustrates the configuration of a digital phase detector of the variable bit synchronizer of FIG. 10.

FIG. 15 diagrammatically illustrates the configuration of digital phase detector 84, as comprising a flip-flop 200, having its clock input 203 coupled to the VBS clock signal line 95 from the octave-stepped divider 181. The D input 201 of flip-flop 200 is coupled to receive the ODATA on line 73 from the opto-electronic receiver 71. ODATA line 73 is further coupled to a first input 211 of an exclusive OR circuit 210. The output Q 205 of flip-flop 200 is coupled to a second input 213 of exclusive OR circuit 210, to a first input 221 of an exclusive OR circuit 220, and to the D input 231 of a flip-flop 230. The output 215 of exclusive OR circuit 210 is coupled via an UP/DN control line 217 to the analog loop filter 88 of FIG. 10. The clock input 233 of flip-flop 230 is coupled to the output of an inverter 240, the input of which is coupled to the VBS clock line 95. The output of inverter 240 is further coupled to a VBSCLOCK output line 98, which is coupled to the descrambler 76 of FIG. 16, to be described. The Q output 235 of flip-flop 230 is coupled to a second input 223 of exclusive OR circuit 220, and to a VBSDATA line 94, which is coupled to the descrambler 76 of FIG. 16. The output 225 of exclusive OR circuit 220 is coupled via a REF line 227 to the analog loop filter 88. Digital phase detector 84 has the essential characteristic, for variable rate operation, of automatic self-centering of the recovered VBSCLOCK relative to the ODATA bit cells.

FIG. 16 diagrammatically illustrates the configuration of a conventional feed-forward, modulo-two descrambler 76, which is configured in a complementary fashion with respect to the scrambler of FIG. 8, described above, and comprises a multibit shift register 260, to a first stage 261 of which the VBSDATA line 94 is coupled. The VBSDATA line 94 is further coupled to a first input 271 of an exclusive OR circuit 270, a second input 273 of which is coupled to an output 285 of an exclusive OR circuit 280. Exclusive OR circuit 280 has first and second inputs 281 and 283 respectively coupled to selected stages of shift register 260, in correspondence with the bit pattern employed in the scrambler of FIG. 8. The output 275 of exclusive OR circuit 270 provides the descrambled data signal DVSBDATA, which is coupled via line 277 to the decoder 77 of FIG. 17. The VBSCLOCK line 98 conveys the VBSCLOCK signal to the decoder.

FIG. 17 diagrammatically illustrates the configuration of the decoder 77, as comprising a 1:9 demultiplexer 300, which is coupled to each of the DVSBDATA line 277 and the VBSCLOCK line 98 from the descrambler 76, and is operative to demultiplex the eight data bits (bits 0–7) of the input DVBSDATA stream on input link 277 onto output bus 311 to a downstream 8:1 multiplexer 320, and the ninth, overhead bit (bit 9) on line 313 to a frame synchronization detector circuit 330. The overhead bit (bit 9) on line 313 corresponds to a respective bit of the pseudo random framing bit pattern generated by the framing sequence generator in the transmitter's pre-scramble encoder (described previously with reference to FIG. 6), which is monitored by frame synchronization detector circuit 330. Frame synchronization detector circuit 330 provides a bit slip signal over line 332 to the 1:9 demultiplexer, for iteratively shifting the received data bits by one bit until frame synchronization is achieved. When the framing pattern is acquired, frame synchronization detector circuit 330 changes the logic level on sync loss line 80, causing the upstream variable bit synchronization circuitry to discontinue the frequency acquisition process, having successfully locked the output frequency of the ×128/N PLL 85 to the ETCLOCK.

Figure 18:
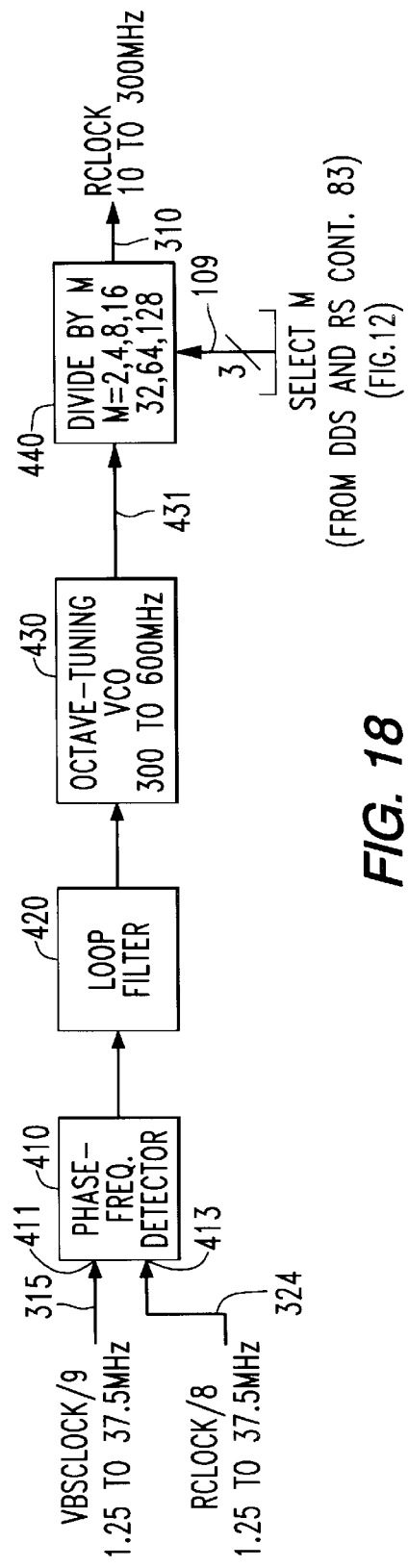
FIG. 18 diagrammatically illustrates the configuration of a times eight (×8) phase locked loop of the receiver of FIG. 9.

When demultiplexing the VBSCLOCK signal, demultiplexer 300 effects a divide-by-nine operation on the VBSCLOCK, so as to divide the VBSCLOCK signal on line 98 by the extended data rate value (nine bits), thereby providing a VBSCLOCK/9 signal (1.25–37.5 MHz) on line 315, which is coupled to the frame synchronization detector circuit 330 and to a times eight (×8) phase locked loop 78, shown in FIG. 18, to be described.

The 8:1 multiplexer 320 has a first output line 321 coupled through a squelch gate 340 to a recovered data output line 341, and a second output line 323 coupled through a squelch gate 350 to a recovered clock output line 351, each of which is coupled through an output interface circuit for delivery to downstream signal processing circuitry (not shown). Similar to demultiplexer 300, when multiplexing recovered data on 8-bit bus 311, 8:1 multiplexer effects a divide-by-eight operation on RCLOCK, so as to provide an RCLOCK/8 clock signal (1.25–37.5 MHz) on line 324, which is coupled to the a times eight (×8) phase locked loop 78, shown in FIG. 18, to be described. Squelch gates 340 and 350 are enabled by loss of signal inputs either through OR gate 345, via line 74 from the opto-electronic receiver 71, or from a loss of sync signal on line 80 from frame sync detector circuit 330.

FIG. 18 diagrammatically illustrates the configuration of the ×8 phase lock circuit for controlling the generation of the recovered clock signal RCLOCK by the 8:1 multiplexer 320 of FIG. 17, as comprising a phase/frequency detector 410 having a first input 411 coupled to receive the (1.25–37.5 MHz) VBSCLOCK/9 clock signal on line 315 from 1:9 demultiplexer 300, and a second input 413 coupled to receive the (1.25–37.5 MHz) RCLOCK/8 signal on line 324 from 8:1 multiplexer 320. The 3-bit select M signal (from the DDS and range controller 83) controls the operation of an octave stepped divider 440.

The output of phase/frequency detector 410 is coupled through a loop filter 420 to an octave-tuning voltage-controlled oscillator 430. The output of octave-tuning voltage-controlled oscillator 430 on line 431 corresponds to the precision reference clock frequency (1.25–37.5 MHz) multiplied by a scaling factor of eight. This precision scaled-up clock signal on line 431 has a frequency in a range of 300–600 MHz and is applied to an octave-stepped divider 440. Under the control of the octave select code provided by the divisor code selector line (select M) 109, the output of octave-stepped divider 440 controllably divides the precision scaled-up (300–600 MHz) clock signal generated by octave-tuning voltage-controlled oscillator 430. The (10–300 MHz) RCLOCK signal output generated by octave-stepped divider 440 is coupled over line 310 to 8:1 multiplexer 320.

OPERATION

As described above, for purposes of providing a non-limiting example, the data rate of the to-be-encoded, scrambled and transmitted signals at the transmit end of the fiber link falls within a clock range of 10–300 MHz. With reference to the transmitter diagram of FIG. 5, as the data TDATA and clock TCLOCK signals are applied to encoder 11, the data is pre-scramble encoded in accordance with the interleaving mechanism described above and detailed in the '600 patent, so as to produce a 9/8 extended data rate ETDATA signal and a 9/8extended data rate ETCLOCK signal (11.25–337.5 MHz) for application to the modulo-two data scrambler 16. The scrambled serial data stream output by scrambler 16 as Scrambled Extended clock Transmit Data (SETDATA) is applied to laser transmitter 18, which emits a scrambled optical signal into an optical fiber link 19 for transmission to a downstream receiver site.

At the downstream receiver shown in FIG. 9, the scrambled serial bit stream ODATA derived by the optical receiver 71 is coupled to the variable bit rate estimator 81 of the variable bit synchronizer 75, the pulse gated counter 105 and associated buffer register 111 produce a fourteen bit binary output code representative of an estimate of the clock rate of the ETCLOCK (11.25–337.5 MHz) that is within a relatively close window of frequency uncertainty of the embedded clock signal.

The fourteen bits of bit rate estimate code are decoded by the decoder 121 within the DDS range selector and controller 83 into a three bit code that selects one of the divisor values N=1, 2, 4, 8, 16 and 32 employed by the frequency range scaler/divider 181 in the ×128/N phase locked loop 85, thereby specifying which octave of the frequency range (11.25–337.5 MHz) contains the embedded ETCLOCK signal. Thus, for example, if the original TCLOCK signal applied to the transmitter encoder has a frequency of 40 MHz, its extended ETCLOCK will have a frequency of 45 MHz, which falls in a window of 37.5–75 MHz, corresponding to a divisor of N=8 for the 300–600 MHz input range of the oscillator 177 of the ×128/N PLL 85 of FIG. 14. The (14-bit) bit rate estimate code is mapped and combined in the controller 83 with the swept twelve-bit digital code from the twelve-bit precision analog-to-digital converter 82, so that the DDS interface 141 produces a thirty two bit code that establishes the reference frequency produced by the DDS 87. Thus, for the above example of an ETCLOCK frequency of 45 MHz, the DDS 87 will generate, within its octave tuning range of 2.34375 to 4.68750 MHz, a reference clock frequency in the vicinity of 2.8125 MHz.

This precision reference clock signal from the DDS 87 is scaled-up by the ×128/N PLL 85 clock signal to a value in the selected octave (here within the 37.5–75.0 MHz octave) so as to produce the variable bit sync clock VBSCLOCK clock signal used by the downstream decoder 77 of FIG. 17 for data recovery. This VBSCLOCK signal is also coupled to the digital phase detector 84 of the 'outer' phase locked loop clock recovery feedback path, containing the swept loop filter 88.

As the phase detector logic processes the ODATA signal on line 73 with the VBSCLOCK signal on line 95, its UP/DN and REF outputs are used to control the tuning of the loop filter 88, in response to the sweep signal from sweep generator 86. As described above, as the loop filter is swept its output is digitized by analog-to-digital converter 82 and fed back as a twelve-bit digital code to the controller 83, wherein it is summed with the mapped 14-bit bit rate estimate code from the bit rate estimator 81, so as to update the value of the thirty-two bit code used to establish the reference frequency produced by the DDS 87.

When the ODATA signal is descrambled by the descrambler 76 and applied to decoder 77, the frame synchronization detector circuit 330 within decoder 77 analyzes successive overhead bits extracted from the descrambled bit stream in accordance with a copy of the reference pseudo random framing bit pattern used by the framing sequence generator in the transmitter's pre-scramble encoder. When the framing pattern is detected, the frame synchronization detector circuit changes the logic level on the sync loss line 80, causing the variable bit synchronization circuitry 81 to discontinue sweeping the analog loop filter output voltage. This locks the output frequency of the DDS 87 to a clock frequency, which, when scaled by the scaling factor of 128/(N=8) of the present example, will precisely match the ETCLOCK of 45 MHz. Namely, for a scaling factor of 128/8=16, the reference clock frequency output by the DDS will be precisely 2.8125 MHz. The 45 MHz demultiplexing the VBSCLOCK signal is scaled by the 8/9 ratio effected by the decoder 77 and its associated ×8 PLL 78, so that the recovered clock signal RCLOCK is exactly the 40 MHz frequency of the TCLOCK at the transmitter.

As will be appreciated from the foregoing description, the inability of conventional high speed digital fiber optic communication systems to accommodate variable data rates is successfully addressed by the data encoding and dual-clock recovery loop mechanism of the present invention, which allows digital data serial communications to be conducted over the fiber at a very wide range of data rates (e.g. 10–300 Mb/s), using a variable data rate bit synchronizer that is able to automatically recover the clock signal embedded in the transported digital data stream, without a priori knowledge of the data pattern or requiring the transmit and receive components to be data rate specific. Namely, the variable data rate bit synchronizer of the invention is capable of accepting any data rate within the operational data clock signal range of the system, and automatically tunes itself to the data clock signal embedded in the received scrambled and encoded serial data stream.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of extracting, from digital data signal, an embedded clock signal that falls within a data clock signal range comprising:

(a) deriving, from said digital data signal, a data rate estimate signal representative of an estimate of the data rate of data contained in said digital data signal, to within a prescribed range of frequency uncertainty;

(b) generating, in accordance with said data rate estimate signal derived in step (a), a first precision reference clock signal that is variable over a first reference clock frequency range, less than said data clock signal range;

(c) applying said first precision reference clock signal to a first tunable phase lock loop circuit, having a first loop acquisition range corresponding to said first reference clock frequency range, said first tunable phase lock loop circuit generating a variable data rate synchronization clock signal that is a selectable multiple of said first precision reference clock signal, said variable data rate synchronization clock signal being variable over a second clock frequency range proximate to said data clock signal range; and (d) applying said digital data signal and said variable data rate synchronization clock signal to a second tunable phase lock loop circuit, having a second loop acquisition range corresponding to said second clock frequency range, said second tunable phase lock loop circuit varying the frequency of said first precision reference clock signal over a third frequency range that encompasses said prescribed range of frequency uncertainty, until said variable data rate synchronization clock signal generated by said first tunable phase lock loop circuit coincides with said embedded clock signal.

2. A method according to claim 1, wherein said second tunable phase lock loop circuit includes a frequency sweep generator which is operative to sweep the output voltage of said second tunable phase locked loop circuit through a range of operation that corresponds to and encompasses the frequency uncertainty of the data rate estimate signal derived in step (a).

3. A method according to claim 1, wherein said digital data signal is formed of a scrambled serial digital bit stream, said serial digital bit stream containing groups of data bits having respective ones of complementary pairs of overhead bits interleaved between successive groups of data bits.

4. A method according to claim 3, wherein step (a) comprises deriving said data rate estimate signal by counting prescribed bit transitions in said scrambled serial digital bit stream during a count measurement interval, and producing therefrom said data rate estimate signal that is representative of said estimate of the data rate of data contained in said digital data signal, in accordance with the number of said prescribed bit transitions counted during said count measurement interval.

5. A method according to claim 3, further including the step of (e) descrambling said scrambled serial digital bit stream using said variable data rate synchronization clock signal.

6. A method according to claim 5, further including the step of (f) decoding the serial digital bit stream descrambled in step (e) to extract said groups of data bits exclusive of said complementary pairs of overhead bits and to derive an output clock signal having a frequency coincident with the data rate of said data bits.

7. A method according to claim 1, wherein step (b) comprises controlling the generation of said first precision reference clock signal in dependence upon contents of said data rate estimate signal derived in step (a) and an output of said second tunable phase lock loop circuit.

8. A method according to claim 1, wherein step (c) comprises selecting said multiple of said first precision reference clock signal in dependence upon contents of said data rate estimate signal derived in step (a).

9. A method according to claim 1, wherein said first tunable phase lock loop circuit comprises a phase detector to which said first precision reference clock signal and a fed back signal are applied, the output of said phase detector being coupled through a loop filter to a controlled oscillator circuit, which produces a multi-octave multiple frequency signal that is a multi-octave multiple of said first precision reference clock signal, said multi-octave multiple frequency signal being divided by a multi-octave divisor to provide said fed back signal, and wherein step (c) further comprises dividing said multi-octave multiple frequency signal produced by said controlled oscillator circuit by a selectable integral value to generate said variable data rate synchronization clock signal.

10. A method for conducting digital data communications between a transmit site and a receive site comprising the steps of:

at said transmit site,
(a) encoding a serial digital bit stream by interleaving respective ones of complementary pairs of overhead bits between successive groups of data bits of said serial digital bit stream, scrambling the resulting encoded serial digital bit stream, and transmitting the scrambled digital bit stream to said receive site; and, at said receive site,
(b) receiving the scrambled digital bit stream transmitted from said transmit site in step (a);
(c) extracting, from said received scrambled digital bit stream, an embedded clock signal therein that falls within a data clock signal range, by
    (c1) deriving, from said received scrambled digital bit stream, a data rate estimate signal representative of an estimate of the data rate of data contained in said received scrambled digital bit stream, to within a prescribed range of frequency uncertainty,
    (c2) generating, in accordance with said data rate estimate signal derived in step (c)(1), a first precision reference clock signal that is variable over a first reference clock frequency range, less than said data clock signal range,
    (c3) applying said first precision reference clock signal to a first tunable phase lock loop circuit, having a first loop acquisition range corresponding to said first reference clock frequency range, said first tunable phase lock loop circuit generating a variable data rate synchronization clock signal that is a selectable multiple of said first precision reference clock signal, said variable data rate synchronization clock signal being variable over a second clock frequency range proximate to said data clock signal range, and
    (c4) applying said received scrambled digital bit stream and said variable data rate synchronization clock signal to a second tunable phase lock loop circuit, having a second loop acquisition range corresponding to said second clock frequency range, said second tunable phase lock loop circuit varying the frequency of said first precision reference clock signal over a third frequency range that encompasses said prescribed range of frequency uncertainty, until said variable data rate synchronization clock signal generated by said first tunable phase lock loop circuit coincides with said embedded clock signal;

(d) descrambling said scrambled serial digital bit stream using said variable data rate synchronization clock signal; and
(e) decoding the serial digital bit stream descrambled in step (d) to extract said groups of data bits exclusive of said complementary pairs of overhead bits and to derive an output clock signal having a frequency coincident with the data rate of said data bits.

11. A method according to claim 10, wherein said second tunable phase lock loop circuit includes a frequency sweep generator which is operative to sweep the output voltage of said second tunable phase locked loop circuit through a range of operation that corresponds to and encompasses the frequency uncertainty of the data rate estimate signal derived in step (c1).

12. A method according to claim 10, wherein step (c1) comprises deriving said data rate estimate signal by counting prescribed bit transitions in said received scrambled serial digital bit stream during a count measurement interval, and producing therefrom said data rate estimate signal that is representative of said estimate of the data rate of data contained in said received scrambled digital bit stream, in accordance with the number of said prescribed bit transitions counted during said count measurement interval.

13. A method according to claim 10, wherein step (c2) comprises controlling the generation of said first precision reference clock signal in dependence upon contents of said data rate estimate signal derived in step (c1) and an output of said second tunable phase lock loop circuit.

14. A method according to claim 10, wherein step (c3) comprises selecting said multiple of said first precision reference clock signal in dependence upon contents of said data rate estimate signal derived in step (c1).

15. A method according to claim 10, wherein said first tunable phase lock loop circuit comprises a phase detector to which said first precision reference clock signal and a fed back signal are applied, the output of said phase detector being coupled through a loop filter to a controlled oscillator circuit, which produces a multi-octave multiple frequency signal that is a multi-octave multiple of said first precision reference clock signal, said multi-octave multiple frequency signal being divided by a multi-octave divisor to provide said fed back signal, and wherein step (c3) further comprises dividing said multi-octave multiple frequency signal produced by said controlled oscillator circuit by a selectable integral value to generate said variable data rate synchronization clock signal.

16. An apparatus for deriving, from a digital data signal, an embedded clock signal that falls within a data clock signal range comprising:

a data rate estimator which derives, from said digital data signal, a data rate estimate signal representative of an estimate of the data rate of data contained in said digital data signal, to within a prescribed range of frequency uncertainty;

a direct digital synthesizer which, in response to said data rate estimate signal derived by said data rate estimator, generates a first precision reference clock signal that is variable over a first reference clock frequency range, less than said data clock signal range;

a first tunable phase lock loop circuit, to which said first precision reference clock signal is applied, said first tunable phase lock loop circuit having a first loop acquisition range corresponding to said first reference clock frequency range, and being operative to generate a variable data rate synchronization clock signal that is a selectable multiple of said first precision reference clock signal, said variable data rate synchronization clock signal being variable over a second clock frequency range proximate to said data clock signal range; and a second tunable phase lock loop circuit, to which said digital data signal and said variable data rate synchronization clock signal are applied, said second tunable phase lock loop circuit having a second loop acquisition range corresponding to said second clock frequency range, and being operative to vary the frequency of said first precision reference clock signal over a third frequency range that encompasses said prescribed range of frequency uncertainty, until said variable data rate synchronization clock signal generated by said first tunable phase lock loop circuit coincides with said embedded clock signal.

17. An apparatus according to claim 16, wherein said second tunable phase lock loop circuit includes a frequency sweep generator which is operative to sweep the output voltage of said second tunable phase locked loop circuit through a range of operation that corresponds to and encompasses the frequency uncertainty of the data rate estimate signal derived by said data rate estimator.

18. An apparatus according to claim 16, wherein said digital data signal is formed of a scrambled serial digital bit stream, said serial digital bit stream containing groups of data bits having respective ones of complementary pairs of overhead bits interleaved between successive groups of data bits.

19. An apparatus according to claim 18, wherein said data rate estimator includes a gated counter circuit, which counts prescribed bit transitions in said scrambled serial digital bit stream during a count measurement interval, and produces therefrom said data rate estimate signal that is representative of said estimate of the data rate of data contained in said digital data signal, in accordance with the number of said prescribed bit transitions counted during said count measurement interval.

20. An apparatus according to claim 18, further including a descrambler which is operative to descramble said scrambled serial digital bit stream using said variable data rate synchronization clock signal.

21. An apparatus according to claim 20, further including a decoder which decodes the serial digital bit stream descrambled by said descrambler and extracts said groups of data bits exclusive of said complementary pairs of overhead bits and derives an output clock signal having a frequency coincident with the data rate of said data bits.

22. An apparatus according to claim 16, further including a direct digital synthesizer controller which controls the generation of said first precision reference clock signal by said direct digital synthesizer in dependence upon contents of said data rate estimate signal derived by said data rate estimator and an output of said second tunable phase lock loop circuit.

23. An apparatus according to claim 22, wherein said direct digital synthesizer controller is operative to control said selectable multiple of said first precision reference clock signal in dependence upon contents of said data rate estimate signal.

24. An apparatus according to claim 16, wherein said first tunable phase lock loop circuit comprises a phase detector to which said first precision reference clock signal and a fed back signal are applied, the output of said phase detector being coupled through a loop filter to a controlled oscillator circuit, which produces a multi-octave multiple frequency signal that is a multi-octave multiple of said first precision reference clock signal, a multi-octave divider which divides said multi-octave multiple frequency signal to provide said fed back signal, and a controlled divider which is operative to divide said multi-octave multiple frequency signal produced by said controlled oscillator circuit by a selectable integral value to generate said variable data rate synchronization clock signal.

25. A system for conducting digital data communications between a transmit site and a receive site comprising:

at said transmit site, a pre-scramble encoder which encodes a serial digital bit stream by interleaving respective ones of complementary pairs of overhead bits between successive groups of data bits of said serial digital bit stream;

a scrambler which scrambles the encoded serial digital bit stream encoded by said pre-scrambled encoder; and a transmitter which transmits the scrambled encoded digital bit stream to said receive site;

at said receive site, a receiver which receives the scrambled encoded digital bit stream transmitted from said transmit site;

a variable bit synchronizer which extracts, from said received scrambled encoded digital bit stream, an embedded clock signal therein that falls within a data clock signal range, said variable bit synchronizer including a data rate estimator which derives, from said received scrambled encoded digital bit stream, a data rate estimate signal representative of an estimate of the data rate of data contained in said received scrambled encoded digital bit stream, to within a prescribed range of frequency uncertainty, a direct digital synthesizer which, in response to said data rate estimate signal derived by said data rate estimator, generates a first precision reference clock signal that is variable over a first reference clock frequency range, less than said data clock signal range, a first tunable phase lock loop circuit, to which said first precision reference clock signal is applied, having a first loop acquisition range corresponding to said first reference clock frequency range, and generating a variable data rate synchronization clock signal that is a selectable multiple of said first precision reference clock signal, said variable data rate synchronization clock signal being variable over a second clock frequency range proximate to said data clock signal range, and a second tunable phase lock loop circuit, to which said received scrambled digital bit stream and said variable data rate synchronization clock signal are applied, said second tunable phase lock loop circuit having a second loop acquisition range corresponding to said second clock frequency range, and being operative to vary the frequency of said first precision reference clock signal over a third frequency range that encompasses said prescribed range of frequency uncertainty, until said variable data rate synchronization clock signal generated by said first tunable phase lock loop circuit coincides with said embedded clock signal;

a descrambler which descrambles said scrambled encoded serial digital bit stream using said variable data rate synchronization clock signal; and a decoder which decodes the descrambled serial digital bit stream to extract said groups of data bits exclusive of said complementary pairs of overhead bits and to derive an output clock signal having a frequency coincident with the data rate of said data bits.

26. A system according to claim 25, wherein said second tunable phase lock loop circuit includes a frequency sweep generator which is operative to sweep the output voltage of said second tunable phase locked loop circuit through a range of operation that corresponds to and encompasses the frequency uncertainty of said data rate estimate signal.

27. A system according to claim 26, wherein said data rate estimator comprises a gate counter which counts prescribed bit transitions in said received scrambled encoded serial digital bit stream during a count measurement interval, and produces therefrom said data rate estimate signal that is representative of said estimate of the data rate of data contained in said received scrambled encoded digital bit stream, in accordance with the number of said prescribed bit transitions counted during said count measurement interval.

28. A system according to claim 25, wherein further including a direct digital synthesizer controller which controls the operation of said direct digital synthesizer, such that said direct digital synthesizer generates said first precision reference clock signal in dependence upon contents of said data rate estimate signal and an output of said second tunable phase lock loop circuit.

29. A system according to claim 28, wherein said direct digital synthesizer controller is operative to control said selectable multiple of said first precision reference clock signal in dependence upon contents of said data rate estimate signal.

30. A system according to claim 25, wherein said first tunable phase lock loop circuit comprises a phase detector to which said first precision reference clock signal and a fed back signal are applied, the output of said phase detector being coupled through a loop filter to a controlled oscillator circuit, which produces a multi-octave multiple frequency signal that is a multi-octave multiple of said first precision reference clock signal, a multi-octave divider which divides said multi-octave multiple frequency signal to provide said fed back signal, and a controlled divider which is operative to divide said multi-octave multiple frequency signal produced by said controlled oscillator circuit by a selectable integral value to generate said variable data rate synchronization clock signal.

31. A data and clock recovery arrangement for use with a system for conducting digital data communications between a transmit site and a receive site, which includes, at said transmit site, a pre-scramble encoder which encodes a serial digital bit stream by interleaving respective ones of complementary pairs of overhead bits between successive groups of data bits of said serial digital bit stream, a scrambler which scrambles the encoded serial digital bit stream encoded by said pre-scrambled encoder, and a transmitter which transmits the scrambled encoded digital bit stream to said receive site and, at said receive site, a receiver which receives the scrambled encoded digital bit stream transmitted from said transmit site, said data and clock recovery arrangement comprising:

a data rate independent variable bit synchronizer which extracts, from said received scrambled encoded digital bit stream, an embedded clock signal therein that falls within a data clock signal range, said data rate independent variable bit synchronizer being capable of accepting any data rate within said data clock signal range, and being operative to automatically tune itself to the data clock signal embedded in the received scrambled encoded serial data stream, and outputting respective scrambled encoded serial data and clock signals;

a descrambler which descrambles said scrambled encoded serial digital bit stream in dependence upon said variable data rate synchronization clock signal; and a decoder which decodes the descrambled serial digital bit stream to extract said groups of data bits exclusive of said complementary pairs of overhead bits and to derive an output clock signal having a frequency coincident with the data rate of said data bits.

32. A data and clock recovery arrangement according to claim 31, wherein said variable bit synchronizer comprises a bit rate estimator that analyzes transitions in said received scrambled encoded serial digital bit stream and derives therefrom an estimate of the data rate to within a prescribed embedded clock signal resolution, a direct digital synthesizer controlled in accordance with said data rate estimate and generating a precision (crystal-sourced) reference clock signal, that is controllably variable over a prescribed clock frequency octave within said data clock signal range, a variable data rate synchronization clock signal generator, including a first tunable phase locked loop, which is locked to said precision reference clock signal, and is operative to scale said precision reference clock signal to a variable data rate synchronization clock signal falling within a frequency range that contains the data rate estimate, said variable data rate synchronization clock signal being applied to said descrambler and to said decoder.

33. A data and clock recovery arrangement according to claim 32, wherein said variable bit synchronizer further comprises a second tunable phase locked loop, having an associated sweep generator which is operative to vary the output voltage of a loop filter therefor over a voltage range that corresponds to and encompasses the frequency uncertainty of said embedded clock signal, until said variable data rate synchronization clock signal generated by said first tunable phase lock loop coincides with said embedded clock signal.

34. A method for recovering a clock signal embedded in a digital bit stream, said embedded clock signal being capable of being any frequency within a prescribed frequency range of variation, comprising the steps of:

(a) processing said digital bit stream to identify an octave within said prescribed frequency range containing said embedded clock and deriving a code representative of an estimate of the frequency of said embedded clock signal within the identified octave, which frequency estimate is within a prescribed frequency uncertainty about said embedded clock frequency;

(b) setting the output frequency of a highly precise reference clock generator having a single octave of tuning range to a frequency value, which, when multiplied by a scaling factor determined in accordance with said code, produces a scaled frequency corresponding to said frequency estimate; and (c) adjusting the value of said code by means of a phase locked loop, to which said scaled frequency signal and said digital bit stream are applied, through a vernier frequency range that encompasses said prescribed frequency uncertainty, until the output frequency of said highly precise reference clock generator, when multiplied by said scaling factor, corresponds to the frequency of said embedded clock.

35. A method according to claim 34, wherein step (a) comprises counting the number of prescribed transitions in said digital bit stream over a count interval to derive said code, step (b) comprises controlling the operation of a direct digital synthesizer in accordance with said code, so that said direct digital synthesizer generates a precision reference clock signal, that is controllably variable over said single octave of tuning range, and step (c) comprises sweeping the output of a loop filter of said phase locked loop through a voltage range corresponding to said vernier frequency range and combining a digital representation of said output of said loop filter with said code to adjust the operation of said direct digital synthesizer, until the output frequency of said direct digital synthesizer, when multiplied by said scaling factor, corresponds to the frequency of said embedded clock.

36. A method according to claim 35, wherein step (b) further comprises applying the output frequency of said direct digital synthesizer to a further phase locked loop having a loop frequency range which corresponds to said single octave of tuning range, and scaling said output frequency as fed back through said further phase locked loop by said scaling factor to produce said scaled frequency corresponding to said frequency estimate.

37. A method for extracting, from a digital data signal, an embedded clock signal that falls within a data clock signal range comprising the steps of:

(a) monitoring said digital data signal and deriving therefrom a data rate estimate signal representative of an estimate of the data rate of data contained in said digital data signal;

(b) generating a reference clock signal having a frequency established in accordance with said data rate estimate signal;

(c) coupling said reference clock signal generated in step (b) to a first input of a phase detector having a second input coupled to receive said digital data signal, and an output;

(d) providing a sweepable loop filter in a loop path including said reference clock signal and said phase detector, thereby forming a phase-locked loop; and (e) controllably sweeping said loop filter, and thereby said phase-locked loop, until said phase detector produces an output representative that said phase-locked loop is locked to said embedded clock signal of said digital data signal.

38. A method according to claim 37, wherein step (a) comprises establishing said reference clock signal in accordance with said data rate estimate signal independently of said phase-locked loop, and wherein step (e) comprises controllably sweeping said loop filter, and thereby said phase-locked loop, independently of said data rate estimate signal, until said phase detector produces an output representative that said phase-locked loop is locked to said embedded clock signal of said digital data signal.

39. A method according to claim 37, wherein step (a) comprises initially establishing said reference clock signal in accordance with said data rate estimate signal independently of said phase-locked loop, and wherein step (e) comprises controllably sweeping said loop filter, and thereby modifying the frequency of said reference clock signal, independently of said data rate estimate signal, until said phase detector produces an output representative that said phase-locked loop is locked to said embedded clock signal of said digital data signal.

40. A method according to claim 37, wherein step (b) comprises generating a digital code that establishes the frequency of said reference clock signal in accordance with said data rate estimate signal, scaling said reference clock signal, and coupling said scaled reference clock signal to said first input of said phase detector, and step (e) comprises controllably sweeping said loop filter, and thereby said phase-locked loop, so as to vary the frequency of said reference clock signal until said variable data rate synchronization clock signal coincides with said embedded clock signal.

41. A method according to claim 40, wherein step (b) comprises scaling said reference clock signal by means of a tunable phase lock loop circuit, which is operative to generate a variable data rate synchronization clock signal that is a selectable multiple of said reference clock signal, step (c) comprises coupling said variable data rate synchronization clock signal generated in step (b) to said first input of said phase detector, and step (e) comprises controllably sweeping said loop filter, and thereby said phase-locked loop, so as to vary the frequency of said reference clock signal until said variable data rate synchronization clock signal coincides with said embedded clock signal.

42. A method according to claim 40, wherein said digital data signal is formed of a scrambled serial digital bit stream, and wherein step (a) comprises deriving said data rate estimate signal by counting bit transitions in said scrambled serial digital bit stream during a count measurement interval, and producing therefrom said data rate estimate signal that is representative of said estimate of the data rate of data contained in said digital data signal, in accordance with the number of said bit transitions counted during said count measurement interval.

43. A method according to claim 42, further including the step of (f) descrambling said scrambled serial digital bit stream using said variable data rate synchronization clock signal.

44. A method according to claim 40, wherein step (b) comprises controlling the generation of said reference clock signal in dependence upon contents of said data rate estimate signal derived in step (a) and an output of said loop filter controllably swept in step (e).

45. A method according to claim 40, wherein step (c) comprises selecting said multiple of said reference clock signal in dependence upon contents of said data rate estimate signal derived in step (a).

46. An apparatus for extracting, from a digital data signal, an embedded clock signal that falls within a data clock signal range comprising:

a data rate estimator coupled to receive said digital data signal and being operative to derive therefrom a data rate estimate signal representative of an estimate of the data rate of data contained in said digital data signal;

a phase-locked loop that includes a reference clock signal generator, a phase detector having a first input coupled to receive said digital data signal, a second input coupled to receive a signal representative of said reference clock signal, and an output, and a sweepable loop filter coupled in a loop path including said reference clock signal generator and said phase detector; and a controller which is operative to establish said reference clock signal generated by said reference clock signal generator in accordance with said data rate estimate signal, and to thereafter controllably sweep said loop filter, and thereby said phase-locked loop, until said phase detector produces an output representative that said phase-locked loop is locked to said embedded clock signal of said digital data signal.

47. An apparatus according to claim 46, wherein said controller is operative to cause said reference clock signal generator to establish said reference clock signal in accordance with said data rate estimate signal independently of said phase-locked loop, and to thereafter controllably sweep said loop filter, and thereby said phase-locked loop, independently of said data rate estimate signal, until said phase detector produces an output representative that said phase-locked loop is locked to said embedded clock signal of said digital data signal.

48. An apparatus according to claim 46, wherein said controller is operative to initially cause said reference clock signal generator to establish said reference clock signal in accordance with said data rate estimate signal independently of said phase-locked loop, and to thereafter controllably sweep said loop filter, and thereby modify the frequency of said reference clock signal generated by said reference clock signal generator, independently of said data rate estimate signal, until said phase detector produces an output representative that said phase-locked loop is locked to said embedded clock signal of said digital data signal.

49. An apparatus according to claim 46, wherein said reference clock signal generator comprises a direct digital synthesizer which generates a digitally established clock signal in accordance with said data rate estimate signal, and a tunable phase lock loop circuit, to which said digitally established clock signal is applied, said tunable phase lock loop circuit being operative to generate a variable data rate synchronization clock signal, which is a selectable multiple of said digitally established clock signal, and is applied to said second input of said phase detector, and wherein said sweepable loop filter is operative to vary the frequency of said digitally established clock signal until said variable data rate synchronization clock signal coincides with said embedded clock signal.

50. An apparatus according to claim 49, wherein said digital data signal is formed of a scrambled serial digital bit stream, and wherein said data rate estimator is operative to count bit transitions in said scrambled serial digital bit stream during a count measurement interval, and produces therefrom said data rate estimate signal that is representative of said estimate of the data rate of data contained in said digital data signal, in accordance with the number of said bit transitions counted during said count measurement interval.

51. An apparatus according to claim 50, further including a descrambler which is operative to descramble said scrambled serial digital bit stream using said variable data rate synchronization clock signal.

52. An apparatus according to claim 49, wherein said controller is operative to control the generation of said digitally established clock signal by said direct digital synthesizer in dependence upon contents of said data rate estimate signal derived by said data rate estimator and an output of said phase-locked loop.

53. An apparatus according to claim 52, wherein said controller is operative to control said selectable multiple of said digitally established clock signal in dependence upon contents of said data rate estimate signal.

\* \* \* \* \*